(12) United States Patent
Zhang et al.

(10) Patent No.: US 12,274,089 B2
(45) Date of Patent: Apr. 8, 2025

(54) STACKED FET SIDEWALL STRAP CONNECTIONS BETWEEN GATES

(71) Applicant: International Business Machines Corporation, Armonk, NY (US)

(72) Inventors: Chen Zhang, Guilderland, NY (US); Julien Frougier, Albany, NY (US); Ruilong Xie, Niskayuna, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 17/706,675

(22) Filed: Mar. 29, 2022

(65) Prior Publication Data

US 2023/0317727 A1 Oct. 5, 2023

(51) Int. Cl.
*H01L 23/532* (2006.01)
*H01L 23/535* (2006.01)
(Continued)

(52) U.S. Cl.
CPC ..... *H10D 84/856* (2025.01); *H01L 23/53257* (2013.01); *H01L 23/535* (2013.01);
(Continued)

(58) Field of Classification Search
CPC ......... H01L 27/0922; H01L 21/823821; H01L 21/823871; H01L 23/53257; H01L 23/535; H01L 27/0924; H01L 29/0665; H01L 29/42392; H01L 29/78696; H01L 21/823475; H01L 27/088; H01L 21/8221; H01L 27/0688; H01L 27/092; H01L 21/76895; H01L 29/0673; H01L 29/775; B82Y 10/00
(Continued)

(56) References Cited

U.S. PATENT DOCUMENTS 9,356,027 B1 5/2016 Cheng et al.
9,711,414 B2 7/2017 Hatcher et al.
(Continued)

FOREIGN PATENT DOCUMENTS

WO 2012067917 A1 5/2012

OTHER PUBLICATIONS

Mohapatra et al., "Design study of gate-all-around vertically stacked nanosheet FETs for sub-7nm nodes," SN Applied Sciences, Apr. 7, 2021, 13 pages, https://doi.org/10.1007/s42452-021-04539-y.

*Primary Examiner* — Vu A Vu
(74) *Attorney, Agent, or Firm* — Matthew Zehrer

(57) ABSTRACT

A set of stacked transistors, system, and method to connect the gates of stacked field-effect transistors through sidewall straps. The set of stacked transistors may include a first transistor including a first gate. The set of stacked transistors may also include a second transistor including a second gate, where the second transistor is above the first transistor. The set of stacked transistors may also include a dielectric preventing direct contact between the first gate and the second gate. The set of stacked transistors may also include a first sidewall strap proximately connected to the first gate and the second gate, where the first sidewall strap connects the first transistor and the second transistor.

20 Claims, 28 Drawing Sheets

(51) Int. Cl.
*H10D 30/67* (2025.01)
*H10D 62/10* (2025.01)
*H10D 84/01* (2025.01)
*H10D 84/03* (2025.01)
*H10D 84/85* (2025.01)

(52) U.S. Cl.
CPC ..... *H10D 30/6735* (2025.01); *H10D 30/6757* (2025.01); *H10D 62/118* (2025.01); *H10D 84/0186* (2025.01); *H10D 84/0193* (2025.01); *H10D 84/038* (2025.01); *H10D 84/853* (2025.01)

(58) Field of Classification Search
USPC .......................................................... 257/253
See application file for complete search history.

(56) References Cited

U.S. PATENT DOCUMENTS

| | | | |
|---|---|---|---|
| 10,566,248 | B1 | 2/2020 | Chanemougame et al. |
| 10,741,456 | B2 * | 8/2020 | Cheng ................. H01L 27/0924 |
| 11,335,606 | B2 * | 5/2022 | Yang ................... H01L 23/5286 |
| 11,670,677 | B2 * | 6/2023 | Jun ................. H01L 21/823418 |
| | | | 257/288 |
| 2020/0294969 | A1 * | 9/2020 | Rachmady ............ H01L 27/088 |
| 2021/0098469 | A1 | 4/2021 | Yang et al. |
| 2021/0202320 | A1 | 7/2021 | Wen et al. |
| 2021/0057544 | A1 | 10/2021 | Lin et al. |
| 2023/0037957 | A1 * | 2/2023 | Thomas ................ H01L 27/092 |
| 2023/0073078 | A1 * | 3/2023 | Rachmady .......... H01L 27/0688 |
| 2023/0086084 | A1 * | 3/2023 | Yun ..................... H01L 29/6656 |
| | | | 257/401 |
| 2023/0101171 | A1 * | 3/2023 | Hong ................... H01L 27/0924 |
| | | | 257/288 |

* cited by examiner

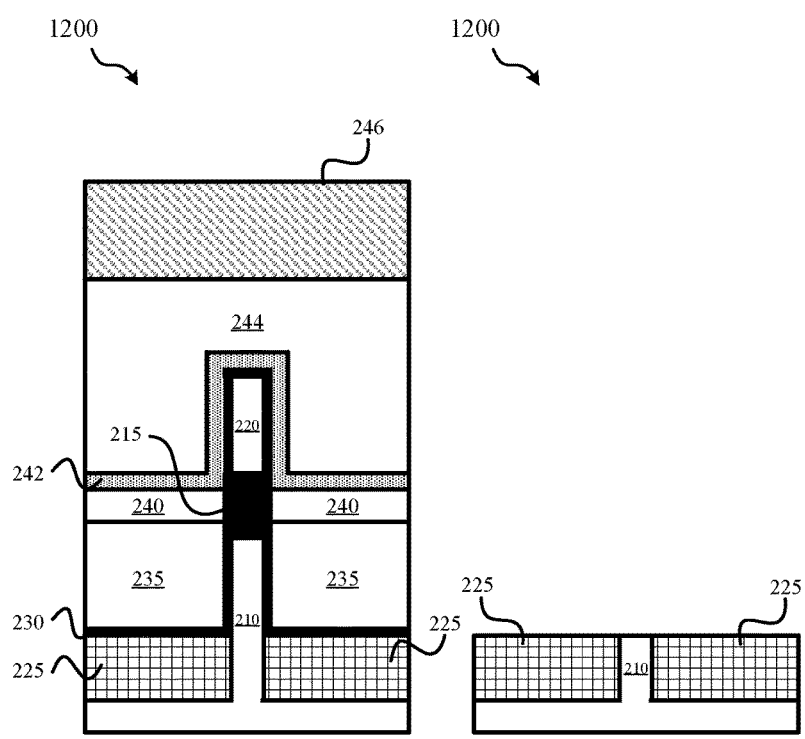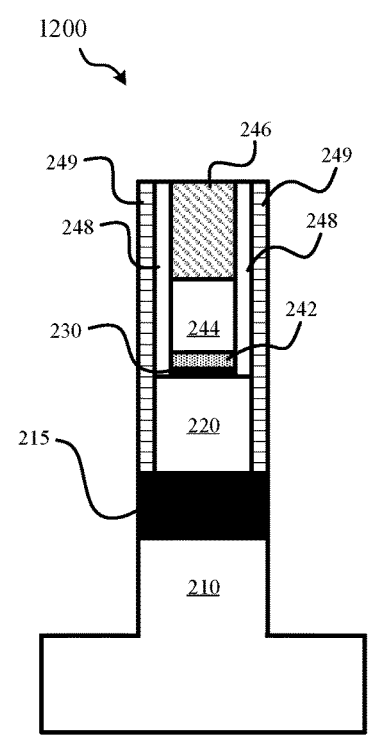
FIG. 12A    FIG. 12B    FIG. 12C

STACKED FET SIDEWALL STRAP CONNECTIONS BETWEEN GATES

BACKGROUND

The present disclosure relates to transistors and, more specifically, to connecting the gates of a stacked field-effect transistor through sidewall straps.

Transistors are devices used to switch or amplify electric current or voltage. Field-effect transistors (FETs) use an electric field effect to control current flow within a semiconductor. FETs may have three terminals—a source, a drain, and a gate. The source may introduce/provide current to the FET. The drain may be the terminal where the current leaves the FET. The gate may be used to control the current flow from the source to the drain. Specifically, FETs may use the electric charge of their gates to affect and control the current flow through the FET channel. Current may flow through the FET using charge carriers that may be either electrons or holes. Electron charge carriers may be negatively charged particles (i.e., electrons) that carry charge and create an electric current. Hole charge carriers (referred to herein as holes) are positions on the FET channel that lack an electron (for instance, at positions where an electron could or should be). These holes may be positive charges, and they may move in an opposite direction of electrons, in some instances. This may result in a current of positive charge created by the holes. The electric charge and/or voltage of the FET gates may be used to control the movements of the electrons and/or holes, which may then affect the current and charge being transmitted through the channel from the source to the drain.

SUMMARY

The present invention provides a set of stacked transistors, a system, and a method to connect the gates of a stacked field-effect transistor through sidewall straps. The set of stacked transistors may include a first transistor including a first gate. The set of stacked transistors may also include a second transistor including a second gate, where the second transistor is above the first transistor. The set of stacked transistors may also include a dielectric preventing direct contact between the first gate and the second gate. The set of stacked transistors may also include a first sidewall strap proximately connected to the first gate and the second gate, where the first sidewall strap connects the first transistor and the second transistor.

The system may include a first transistor including a first gate. The system may also include a second transistor including a second gate, where the second transistor is above the first transistor. The system may also include a dielectric preventing direct contact between the first gate and the second gate. The system may also include a first sidewall strap proximately connected to the first gate and the second gate, where the first sidewall strap connects the first transistor and the second transistor.

The method may include forming a first semiconductor and a second semiconductor separated by an insulator layer. The method may also include shaping the first semiconductor and the second semiconductor into a first channel and a second channel. The method may also include forming a first gate. The method may also include depositing a dielectric layer on top of the first gate. The method may also include forming a second gate on top of the dielectric layer, where the dielectric layer separates the first gate from the second gate. The method may also include forming a first sidewall strap proximately connected to the first gate and the second gate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 12A depicts a first cross-sectional view of an intermediate step for forming stacked FETs with sidewall straps of etching a bottom portion of the fin, according to some embodiments.

FIG. 12B depicts a second cross-sectional view of an intermediate step for forming stacked FETs with sidewall straps of etching a bottom portion of the fin, according to some embodiments.

FIG. 12C depicts a third cross-sectional view of an intermediate step for forming stacked FETs with sidewall straps of etching a bottom portion of the fin, according to some embodiments.

Figure 1:
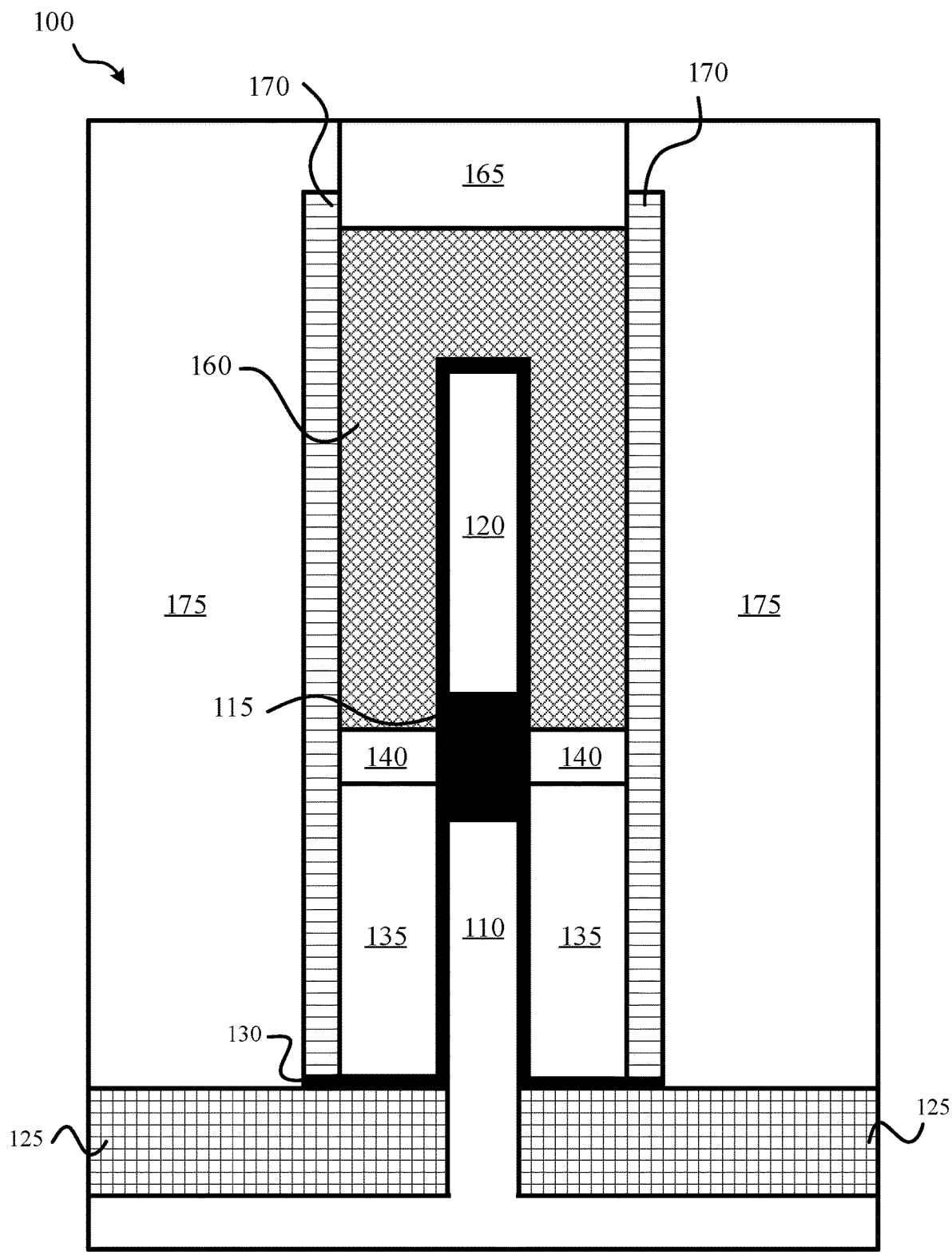
FIG. 1 depicts exemplary stacked FETs with sidewall straps, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relates to transistors and, more specifically, to connecting the gates of a stacked field-effect transistor through sidewall straps. While the present disclosure is not necessarily limited to such applications, various aspects of the disclosure may be appreciated through a discussion of various examples using this context.

Transistors, such as field-effect transistors (FETs), may be used within a system (for example, within a semiconductor) to switch or amplify electric current or voltage. FETs may have two typical configurations, N-channel FETs (NFETs) and P-channel FETs (PFETs). In some instances, it may be beneficial to have multiple FETs connected to each other. For example, in logic gate designs, an N-gate from an NFET may need to be electrically connected to a P-gate from a PFET in order to form an input for the logic gate. A logic gate may be a circuit with one or more inputs (for example, any number of inputs), but only one output. Because an NFET has electrons as the majority carrier, NFETs may pass a signal (i.e., conduct current) when the gate voltage is high and may not conduct current when the voltage is low. On the other hand, because a PFET has holes as the majority carrier, PFETs may pass a signal (i.e., conduct current) when the gate voltage is low and may not conduct current when the voltage is high.

In some instances, combining NFET and PFET in a logic gate design can eliminate large current leakage from VDD (a positive supply voltage) to ground in a static/non-switching period, as one of the transistors will be off which may prevent different shorts between VDD and ground. This design is conventionally referred to as a complementary metal-oxide-semiconductor (CMOS) logic design. Because of the benefits of combining NFET and PFET in a logic gate design, various logic designs may include NFET and PFET pairs, and in each NFET-PFET pair the transistors may share the same input (i.e., their gates are electrically connected), in some instances. In various other circuit designs, it may be beneficial to not connect NFET and PFET within the NFET-PFET pair or to not have an NFET-PFET pair at all. As technology advances, it has become more and more beneficial to have large amounts of technology and components in very small spaces. Therefore, scaling of the various components may be very advantageous. For instance, in complementary metal-oxide-semiconductors (CMOS) or any other semiconductors, area scaling may help reduce the dimensions of the technology/components (for example, the dimensions of the base of the components) without reducing the capabilities of the components. One method of area scaling within a semiconductor is to stack transistors. Stacking transistors may increase the height of the semiconductor chip, but may reduce the area on the chip taken up by transistors. This may help scale the area of the chip, in some instances, which may allow for more components on the surface of a chip or may allow for a smaller chip.

For example, for logic gate designs, the connected NFET and PFET may be stacked on top of each other in order to have the benefit of the NFET-PFET pair (discussed above) while also saving space and reducing the area on the chip taken up by the NFET and PFET. In conventional stacked transistors for logic gate designs, the N gate and P gate (from the NFET and PFET) may be connected (to form the input) through a direct electric connection between the N gate and P gate. For instance, there may be a first metal used for the N gate (referred to as the N metal) that is removed from the P gate and then a second metal used for the P gate (referred to as the P metal) that may be directly deposited on the P gate and also on top of the N metal. However, this direct connection may cause issues for the stacked transistors. For instance, the process may become very challenging regarding how to selectively remove gate metals from only the PFET or NFET. In a conventional, non-stacked transistor, selectively removing gate metals may be done through lithographical patterning, for example. However, for stacked FETs, as NFET and PFET are stacked vertically, conventional methods may not be able to achieve (or it may be very difficult to achieve) the selective removal of the gate metal (s). Further, in conventional non-stacked transistors, lithographical patterning may be used to disconnect the N gate and P gate in some NFET-PFET pairs while keeping the connections in other pairs, but for stacked transistors, this again may be very difficult to achieve using conventional methods such as lithographical patterning.

The present disclosure provides a stacked transistor, system, and method to connect the gates of a stacked field-effect transistor through sidewall straps. Here, instead of having direct contact and a direct connection between the N gate and P gate (and the corresponding N metal and P metal), sidewall straps may be used to connect the gates. By connecting the gates through sidewall straps, the negative effects of the stacked design may be prevented as the N and P gates are not directly in contact. Further, the sidewall straps allow for flexibility and customizability for the stacked transistors. For instance, there may be situations where it is desired to have the N and P gates separated within the stacked transistor (i.e., the NFET and PFET are stacked but not connected), or where it is desired to have a lesser connection between the N and P gates (for example, a smaller contact area). In these instances, the stacked transistors with the desired lesser connection or no connection between the two gates may be masked on one or more sides, which may result in stacked transistors with a single sidewall strap or no sidewall straps connecting the N gate and the P gate. Further, each stacked transistor on a chip may be individually customized. For example, one chip may have a stacked transistor with two sidewall straps, a stacked transistor with a single sidewall strap, and a stacked transistor with no sidewall straps connecting the N gate and the P gate for that specific stacked transistor. This is further discussed herein.

Referring now to FIG. 1, exemplary stacked transistors 100 with sidewall straps 170 are depicted, according to some embodiments. In some instances, stacked transistors 100 are stacked field-effect transistors (FETs) such as fin field-effect transistors (finFETs). Stacked transistors 100 include two channels—channel 110 and channel 120. Each channel 110, 120 may correspond to a transistor from the stacked transistors. Put differently, channel 110 may be the channel for a first transistor and channel 120 may be a channel for the second transistor. In some instances, as discussed herein, the stacked transistors 100 may include a transistor with an N-channel (referred to as an NFET) and a transistor with a P-channel (referred to as a PFET). Therefore, in some instances, channel 110 may be an N-channel and channel 120 may be a P-channel, or vice versa.

Channels 110 and 120 are separated by an insulator material 115 (referred to herein as insulator 115). Insulator 115 may help prevent any unwanted current transfer or other negative effects between the two channels 110 and 120. For instance, channel 110 may be a part of a different transistor than channel 120, and vice versa, therefore the channels 110 and 120 are separated by insulator 115 to prevent each channel (110 and 120) from negatively affecting the other channel due to their close proximity in the stacked format.

As discussed above, gates are used to control current flow through the channels. For stacked transistors 100, gate 160 is used to control current flow through channel 120 and gates 135 are used to control current flow through channel 110. The gates 135 and 160 may control current through their respective channels 110 and 120 by using the electric charge and/or voltage of the gates to control the movements of the electrons and/or holes in the channels 110 and 120. For example, if channel 110 and gates 135 are part of an NFET, channel 120 and gate 160 may be a part of a PFET. As holes may be the majority charge carrier for channel 120, in this example, a positive voltage (i.e., a voltage higher than source voltage) from gate 160 may slow down and/or stop the flow through the channel 120, as the positive voltage from the gate 160 may repel the hole charge carriers in the channel 120. Further, a negative voltage (i.e., a voltage lower than source voltage) from the gate 160 may open up the channel 120, as the negative voltage may attract holes in the channel) and may allow positive charge to flow more easily through the hole charge carriers and the channel 120.

Stacked transistors 100 may include a dielectric 140 to isolate gates 135 and gate 160 from each other. Instead of gates 135 and gate 160 being in direct contact with each other, stacked transistors 100 include sidewall straps 170 to connect the gates (135 and 160). This way, gates 135 and 160 may still be connected (for example, to form an input in a logic gate design) through the sidewall straps 170, but the gates 135 and 160 are not in direct contact with each other. This may allow for selective removal of gate metals from only one of the stacked transistors, as the gates 135 and 160 are not in direct contact. Further, having the sidewall straps 170 may allow for the formation of multiple sets of stacked transistors with differing connections between the gates 135 and 160 (through the removal of various sidewall straps 170, discussed further herein).

Sidewall straps 170 may be described, herein, as proximately connected to both gates 135 and gate 160. The term "proximately connected" may be used herein to describe a connection between two components, specifically components that are directly connected to or touching each other, and/or, for example, components that would be directly connected but for the oxide layer between them. For example, gates 135 may be described as proximately connected to sidewall straps 170, as they are in direct contact with each other. However, gates 135 may not be described as proximately connected to gate 160, as they are separated by dielectric 140 and are not in direct contact with each other. Thus, even though gates 135 may have an electrical connection to both sidewall straps 170 and gate 160, gates 135 are more directly connected to sidewall straps 170, and thus are proximately connected to sidewall straps 170. However, as mentioned above, sidewall straps 170 are proximately connected to both gates 135 and 160, as the sidewall straps 170 are in direct contact with each of the gates (135 and 160).

Stacked transistors 100 further include dielectric 125. Dielectric 125 may be part of a shallow trench isolation, in some instances, and may help prevent electric current from the stacked transistors 100 (for example, from channel 110 and/or gates 135) from transmitting or leaking to other devices/components on the chip (not pictured). For further prevention of current and/or heat transfer, stacked transistors 100 also include a dielectric 175 proximately connected to the sidewall straps. In some instances, dielectric 175 may be a low-k dielectric such as interlayer dielectric (ILD), for example. Dielectric 175 may act as an insulator and may help prevent heat or current transfer between stacked transistors 100 and any other components of a device/system (and vice versa).

In some instances, as depicted in FIG. 1, stacked transistors 100 include a cap 165. Cap 165 helps protect gate 160 and may isolate gate 160 from other possible components of the chip/device. For example, other components (not depicted) may be stacked on top of stacked transistors 100, however these other components may not have any connection to stacked transistors 100 nor gate 160. Cap 165 may cap off gate 160 and prevent any unwanted connections from forming between gate 160 and other components.

Although stacked transistors 100 are depicted as having cap 165, this is just an exemplary embodiment and there may be instances where stacked transistors 100 do not include cap 165. For example, there may be instances where other components are stacked on top of stacked transistors 100, and these other components are intended to be connected to gate 160 and/or stacked transistors 100. In this example, it may be desired to have access to gate 160 so that a connection may be formed with other components. Therefore, by not having a cap 165, in this example, gate 160 may be accessible to form these connections.

Stacked transistors 100 may also include a high-k dielectric layer 130 between the channels 110 and 120 and their respective gates 135 and 160 (as depicted in FIG. 1). A high-k dielectric, as referred to herein, is a dielectric with a higher dielectric constant (for instance, when compared to silicon dioxide ($SiO_2$). High-k dielectric layer 130 may act as a gate dielectric, in some instances. When gate voltage is applied to gates 135 and 160, the voltage may induce charges in the channels 110 and 120 through a capacitive effect, as the voltage travels first through high-k dielectric 130 before reaching channels 110 and 120. High-k dielectric 130 may be able to hold the charge and/or voltage, and may act almost as a filter between the gates 135 and 160 and the channels 110 and 120 and may allow for voltage to travel smoothly from the gates 135 and 160 to the channels 110 and 120.

Figure 2:
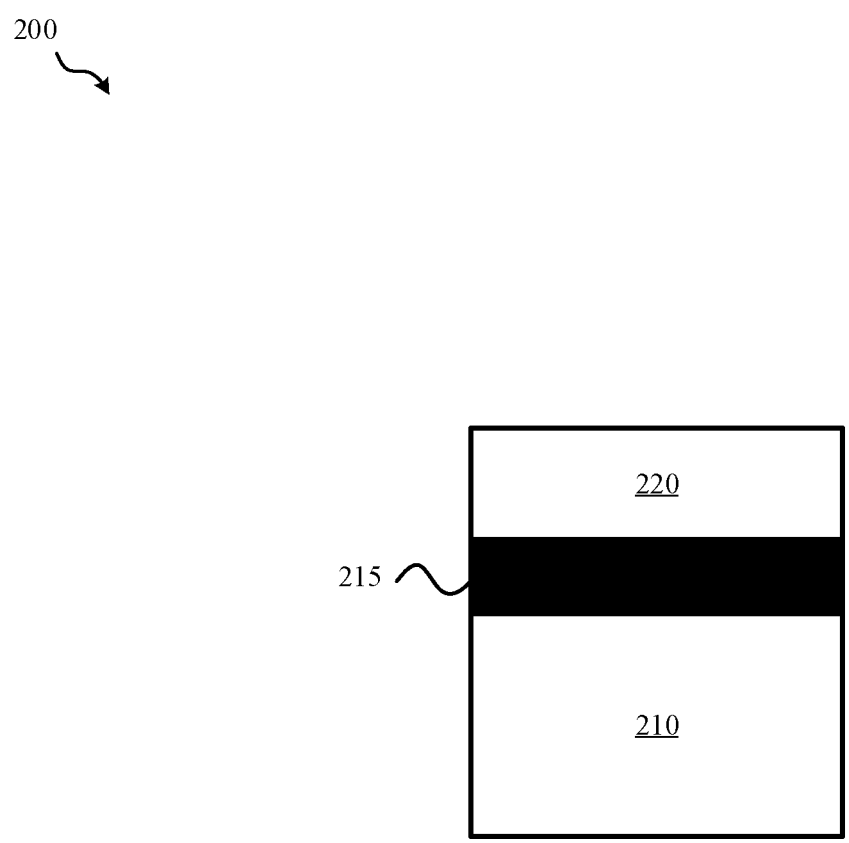
FIG. 2 depicts an intermediate step for forming stacked FETs with sidewall straps, according to some embodiments.

Referring to FIG. 2, an intermediate step 200 for forming stacked FETs with sidewall straps is depicted, according to some embodiments. In some instances, intermediate steps 200 (FIG. 2)-2500 (FIG. 25), or any number of these steps, may be steps in forming stacked transistors 100. In intermediate step 200, a substrate, such as a semiconductor on insulator type substrate, is formed. This type of substrate (for example a silicon on insulator (SOI) substrate or any other semiconductor on insulator substrate) may include an insulator layer between two semiconductor layers (for instance, containing silicon). In this instance, the substrate includes two semiconductor regions (210 and 220) separated by an insulator layer 215 (for instance, a dielectric layer). Although semiconductor layers 210 and 220 have been discussed herein as containing silicon, semiconductor layers 210 may contain other materials, such as germanium, etc., instead of silicon. Further, the semiconductor layers 210 and 220 may contain a combination of materials (i.e., compounds), such as silicon carbide (SiC), Gallium arsenide (GaAs), etc. In some instances, semiconductor layers 210 and 220 may be different material(s). In some instances, semiconductor layers 210 and 220 may be the same material(s). Insulator layer 215 may be dielectric such as $SiO_2$, SiN, or any other dielectric, in some instances.

In some embodiments, intermediate step 200 may include depositing semiconductor layer 210, depositing insulator layer 215, and depositing semiconductor layer 220. These layers may be deposited through atomic layer deposition (ALD), chemical vapor deposition (CVD), laser induced chemical vapor deposition (LCVD), and/or any other applicable deposition technique. In some instances, one or more of the layers (210, 215, and 220) are deposited using the same technique; in some instances each layer (210, 215, and 220) may be deposited using a different technique.

Figure 3:
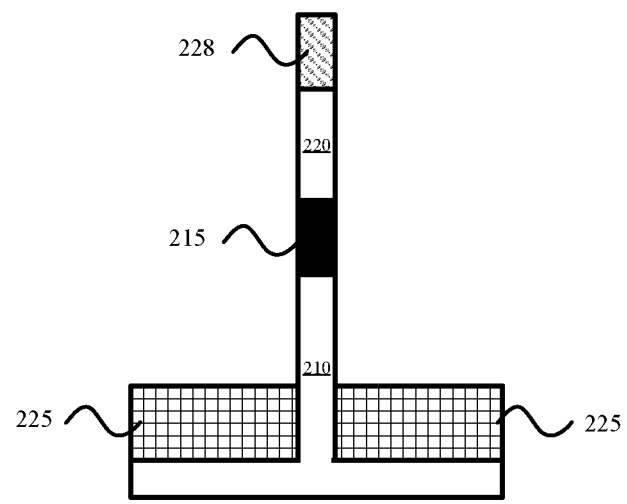
FIG. 3 depicts an intermediate step for forming stacked FETs with sidewall straps of etching and forming the fin, according to some embodiments.

Referring now to FIG. 3, an intermediate step 300 of shaping (i.e., etching and forming) the fin is depicted, according to some embodiments. Put differently, intermediate step 300 may include shaping semiconductor layers 210 and 220 into channels. To shape into channels, semiconductor layers 210 and 220 along with insulator layer 215 may be patterned to remove excess material and form a fin. The patterning may include etching (such as reactive ion etching (RIE)), in some instances. By removing the excess material, semiconductor layers 210 and 220 may become (and may be referred to herein as) channels 210 and 220. Channel 210 may be a part of a first transistor and channel 220 may be a part of a second transistor stacked on top of the first transistor.

Additionally, intermediate step 300 may include depositing a hard mask 228 on top of channel 220 (i.e., masking channel 220). This may protect channel 220 and may prevent it from being unnecessarily etched or removed. Intermediate step 300 may also include depositing and/or forming dielectric 225. Dielectric 225 may be $SiO_2$, SiN, or any other dielectric. In some instances, dielectric 225 is formed through shallow trench isolation (STI). Specifically, trenches—or any other open space—may be carved/etched in semiconductor 210 (from FIG. 2) and the dielectric 225 may be deposited in these open spaces. In some instances, any excess dielectric 225 may be removed through reactive ion etching (RIE), chemical mechanical planarization (CMP), or any other removal technique. Dielectric 225 may help prevent electric current and/or heat from leaking or transmitting to other portions of a device, and may also help protect the components (such as channel 210, channel 220, etc.) from being exposed to heat or current from those other portions of the device.

Figure 4:
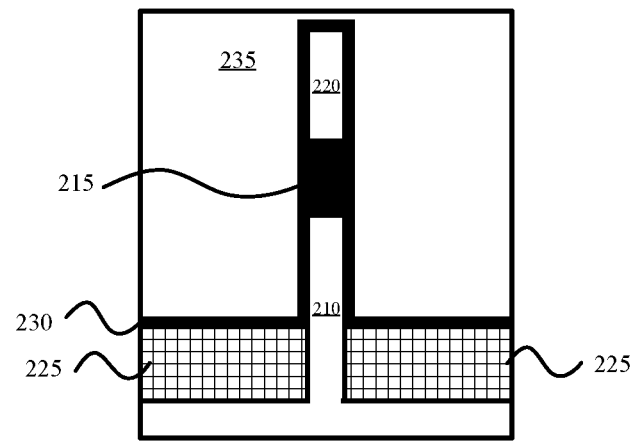
FIG. 4 depicts an intermediate step for forming stacked FETs with sidewall straps of depositing a first metal, according to some embodiments.

Referring to FIG. 4, an intermediate step 400 of depositing a first metal 235 is depicted, according to some embodiments. First metal 235 will become the gates for channel 210 (discussed further, herein). Metal 235 may be titanium nitride (TiN), titanium aluminum carbide (TiAlC), etc. In some instances, first metal 235 may be a combination of metals. For example, metal 235 may include a combination of TiN and TiAlC layers (for instance, the layers may be alternating layers). In some instances, metal 235 may be deposited through atomic layer deposition (ALD), chemical vapor deposition (CVD), laser induced chemical vapor deposition (LCVD), and/or any other applicable deposition technique.

In some instances, as depicted in FIG. 4, intermediate step 400 may include depositing high-k dielectric 230 prior to the deposition of metal 235. A high-k dielectric (such as high-k dielectric 130 (FIG. 1) and/or high-k dielectric 230 (FIG. 4)) may help prevent damage to components (such as channels 210 and 220) and may help prevent current leakage to or from channels 210 and 220. Specifically, the high-k dielectric 230 may act as a gate dielectric and may induce charges in the channels 210 and 220 through a capacitive effect, as the voltage is transmitted through high-k dielectric 230 before reaching channels 210 and 220. This may be discussed further herein in reference to high-k dielectric 130 (FIG. 1). In some instances, high-k dielectric 230 may be a high-k oxide. In some instances, high-k dielectric 230 may be a material such as zirconium dioxide, zirconium silicate, hafnium dioxide, etc. High-k dielectric 230 may be deposited using atomic layer deposition (ALD), chemical vapor deposition (CVD), laser induced chemical vapor deposition (LCVD), or any other applicable deposition technique. In some instances, depositing high-k dielectric 230 may include removing any excess material after the deposition.

Figure 5:
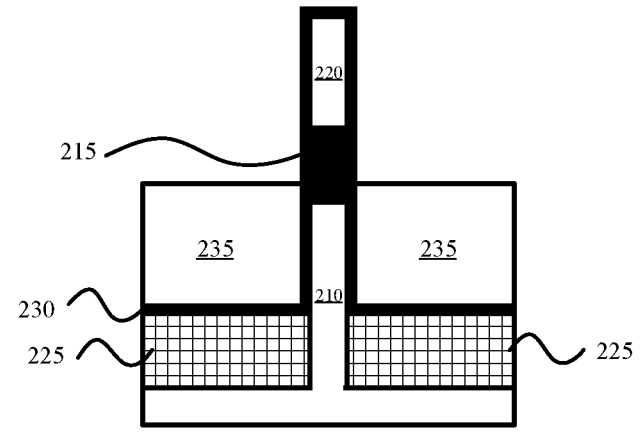
FIG. 5 depicts an intermediate step for forming stacked FETs with sidewall straps of recessing the first metal, according to some embodiments.

Referring now to FIG. 5, an intermediate step 500 of recessing the first metal 235 is depicted, according to some embodiments. In some instances, not all of the metal 235 that was deposited during intermediate step 400 (FIG. 4)

may be needed for the stacked transistors. Therefore, intermediate step 500 may include removing portions of metal 235 (i.e., the excess material). This way, only the necessary gate material of first metal 235 may remain. First metal 235 may be referred to herein as gate(s) 235, as metal 235 may become gate(s) 235 (for instance, once the excess material is removed). The portions of metal 235 (i.e., the excess metal) may be removed through reactive ion etching (RIE), chemical mechanical planarization (CMP), or any other applicable removal technique. In some instances, the depositing of the first metal 235 (from intermediate step 400) and the recessing of the first metal 235 (intermediate step 500) may be referred to collectively as forming the first gate 235.

Figure 6:
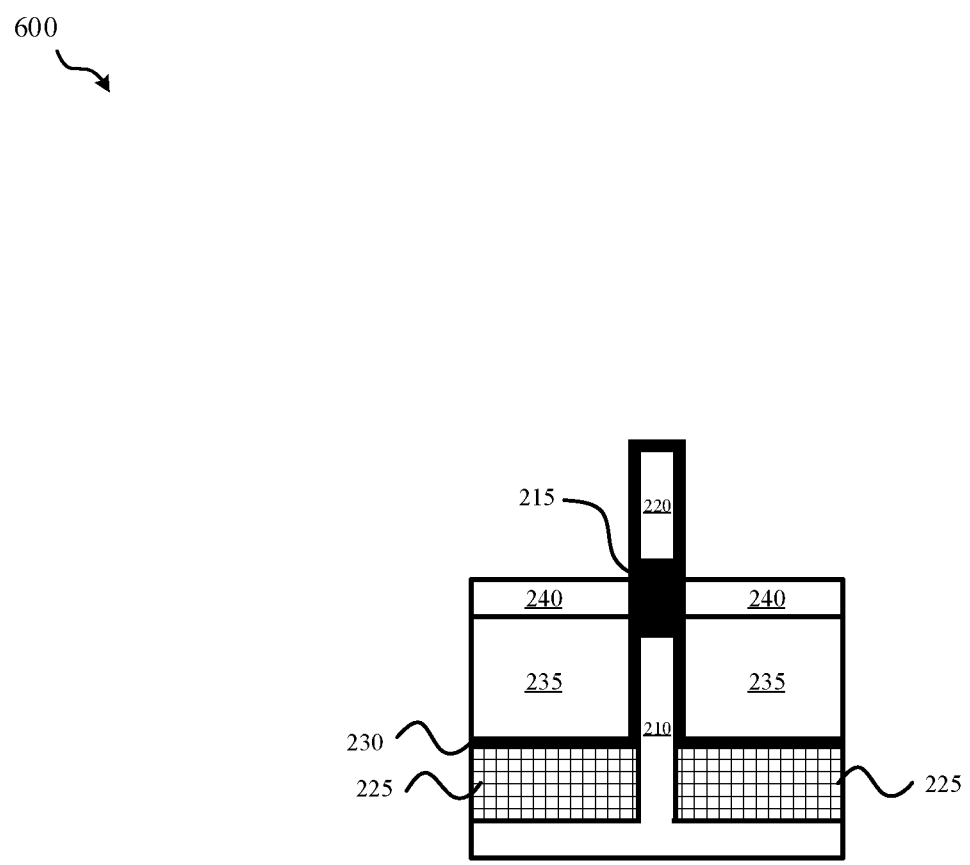
FIG. 6 depicts an intermediate step for forming stacked FETs with sidewall straps of depositing a dielectric layer, according to some embodiments.

Referring to FIG. 6, an intermediate step 600 of depositing a dielectric layer 240 is depicted, according to some embodiments. Dielectric layer 240 may isolate gates 235 from any other gates in the stacked transistors. This may help prevent negative effects (such as an N-P local layout effect) due to direct contact between the gates. In some instances, dielectric layer 240 may be deposited through atomic layer deposition (ALD), chemical vapor deposition (CVD), laser induced chemical vapor deposition (LCVD), etc. Dielectric layer 240 may be dielectric such as $SiO_2$, SiN, or any other dielectric, in some instances.

Figure 7:
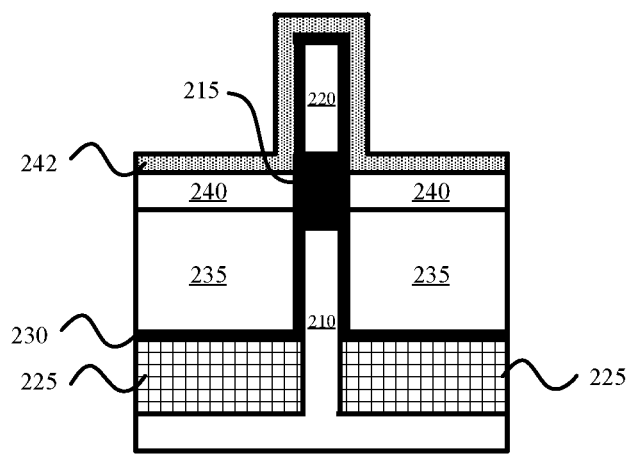
FIG. 7 depicts an intermediate step for forming stacked FETs with sidewall straps of depositing an etch stop layer, according to some embodiments.

Referring to FIG. 7, an intermediate step 700 of depositing an etch stop layer 242 is depicted, according to some embodiments. Etch stop layer 242 may serve as a sacrificial layer to help prevent any accidental removal of high-k dielectric 230, channel 220, dielectric 240, etc. For instance, in future steps (discussed herein), there may etching done to various components of the stacked transistors. Without etch stop layer 242, there may be instances where the etching goes slightly too far and removes portions of high-k dielectric 230, channel 220, dielectric 240, etc. To help prevent this unwanted removal, etch stop layer 242 may serve as a barrier and/or an etch stop in order to help indicate where the etching needs to stop and also to protect other components from being etched. Etch stop layer 242 may be deposited through any applicable deposition technique. In some instances, etch stop layer 242 may be a material such as TiN, TaN, etc.

Figures 8A, 8B, 8C:
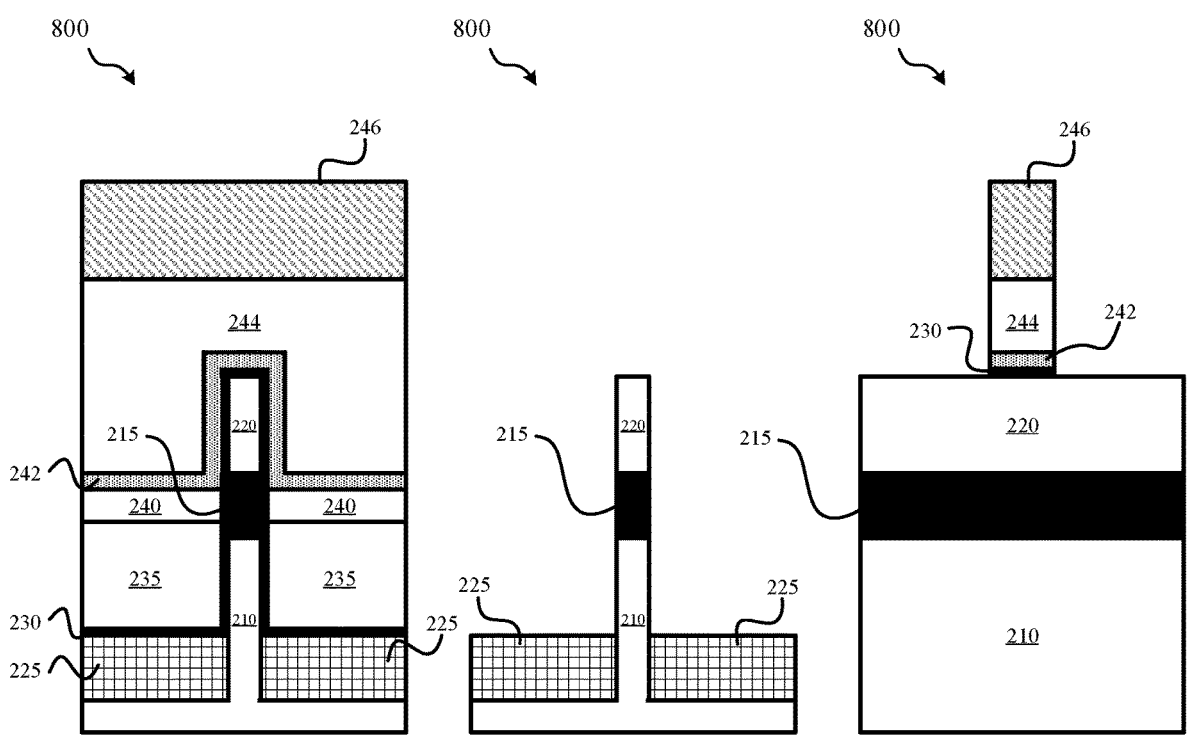
FIG. 8A depicts a first cross-sectional view of an intermediate step for forming stacked FETs with sidewall straps of forming the gate structure, according to some embodiments.
FIG. 8B depicts a second cross-sectional view of an intermediate step for forming stacked FETs with sidewall straps of forming the gate structure, according to some embodiments.
FIG. 8C depicts a third cross-sectional view of an intermediate step for forming stacked FETs with sidewall straps of forming the gate structure, according to some embodiments.

Referring to FIGS. 8A-8C, various cross-sectional views of an intermediate step 800 of forming the gate structure are depicted, according to some embodiments. Intermediate steps 800-2300 (i.e., FIGS. 8A-23C) may include multiple views of each intermediate step. The A view (for example, the view depicted in FIG. 8A, FIG. 9A, FIG. 10A, etc., through FIG. 23A) may be a vertical cross section (referred to herein as the A view cross section) down the middle/center of the stacked transistors. The A view cross section may also be referred to as the across fin cross section. The B view (for example, the view depicted in FIG. 8B, FIG. 9B, FIG. 10B, etc., through FIG. 23B) may be a vertical cross section (referred to herein as the B view cross section) parallel to the A view cross section, however the B view cross section may be further behind the A view cross section (i.e., not down the middle/center) from the perspective of the A view cross section. Put more simply, the B view cross section may depict the S/D region of the stacked transistors, and may also be referred to as the S/D cross section. The C view (for example, the view depicted in FIG. 8C, FIG. 9C, FIG. 10C, etc., through FIG. 23C) may be a vertical cross section (referred to herein as the C view cross section) perpendicular to the A view cross section. For instance, the C view cross section may also be a vertical cross section down the middle of the stacked transistors, however the C view cross section may be perpendicular to the A view cross section. The B view cross section may also be perpendicular to the C view cross section, however the B view cross section may be towards the right or left ends and not down the middle/center from the perspective of the C view cross section. The C view cross section may also be referred to as the across gate cross-section.

In intermediate step 800, a dummy gate 244 and a hard mask 246 may be deposited on top of the etch stop layer 242. Dummy gate 244 may be a dummy component that serves as a placeholder for the second gate. As discussed herein, stacked transistors may include two transistors, one stacked on top of the other. Each transistor may include its own channel and gate(s), in some instances. In intermediate step 800, channel 210 and gates 235 may be the channel and gates for a first transistor. Further, channel 220 may be the channel for a second transistor. However, additional formation steps may occur before the gate(s) for the second transistor can be deposited. Therefore, dummy gate 244 may be deposited to act as a placeholder and prevent other materials from being deposited in the space where the gate(s) will eventually occupy. The term dummy, as referred to herein, refers to having no functionality. Therefore, the dummy gate 244 may have no functionality and may simply occupy the space for the future gate(s).

Hard mask 246 may be used to protect components of the stacked transistors. For instance, there may be etching that occurs in future steps when forming the stacked transistors (e.g., stacked FETs). The hard mask 246 may protect the components underneath it and may prevent them from being etched (for example, preventing the components from being accidentally etched or removed). In some instances, hard mask 246 may include silicon (Si).

As depicted in FIGS. 8B and 8C, hard mask 246 and dummy gate 244 may not be as thick as the channels 210 and 220. For instance, FIG. 8C depicts that hard mask 246 and dummy gate 244 are only on a middle portion of the stacked transistors. Further, FIG. 8B depicts a portion of the stacked transistors behind FIG. 8A, and the portion of the transistors depicted in FIG. 8B do not include hard mask 246 and dummy gate 244. Therefore, in some instances, dummy gate 244 and hard mask 246 are only deposited on a middle portion of the stacked transistors (as depicted in FIG. 8C). In some instances, depositing dummy gate 244 and hard mask 246 may include removing excess material (for example, using RIE, CMP, etc.).

Figures 9A, 9B, 9C:
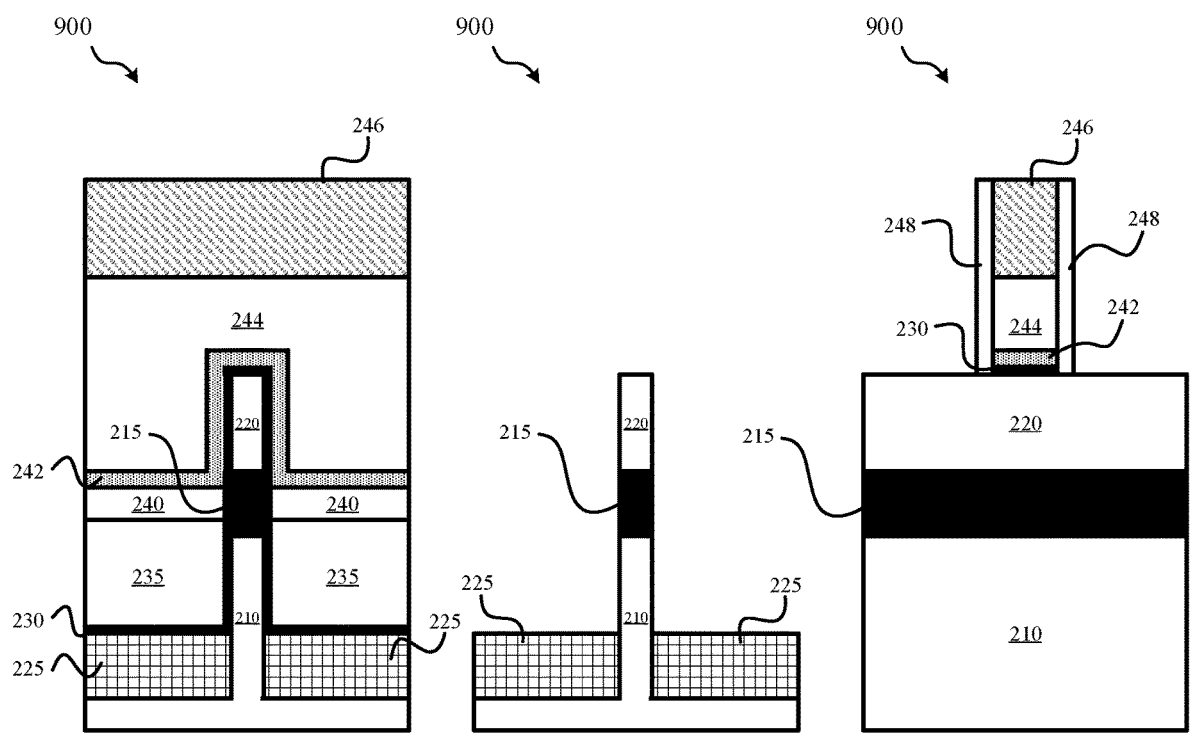
FIG. 9A depicts a first cross-sectional view of an intermediate step for forming stacked FETs with sidewall straps of forming gate spacers, according to some embodiments.
FIG. 9B depicts a second cross-sectional view of an intermediate step for forming stacked FETs with sidewall straps of forming gate spacers, according to some embodiments.
FIG. 9C depicts a third cross-sectional view of an intermediate step for forming stacked FETs with sidewall straps of forming gate spacers, according to some embodiments.
Figures 10A, 10B, 10C:
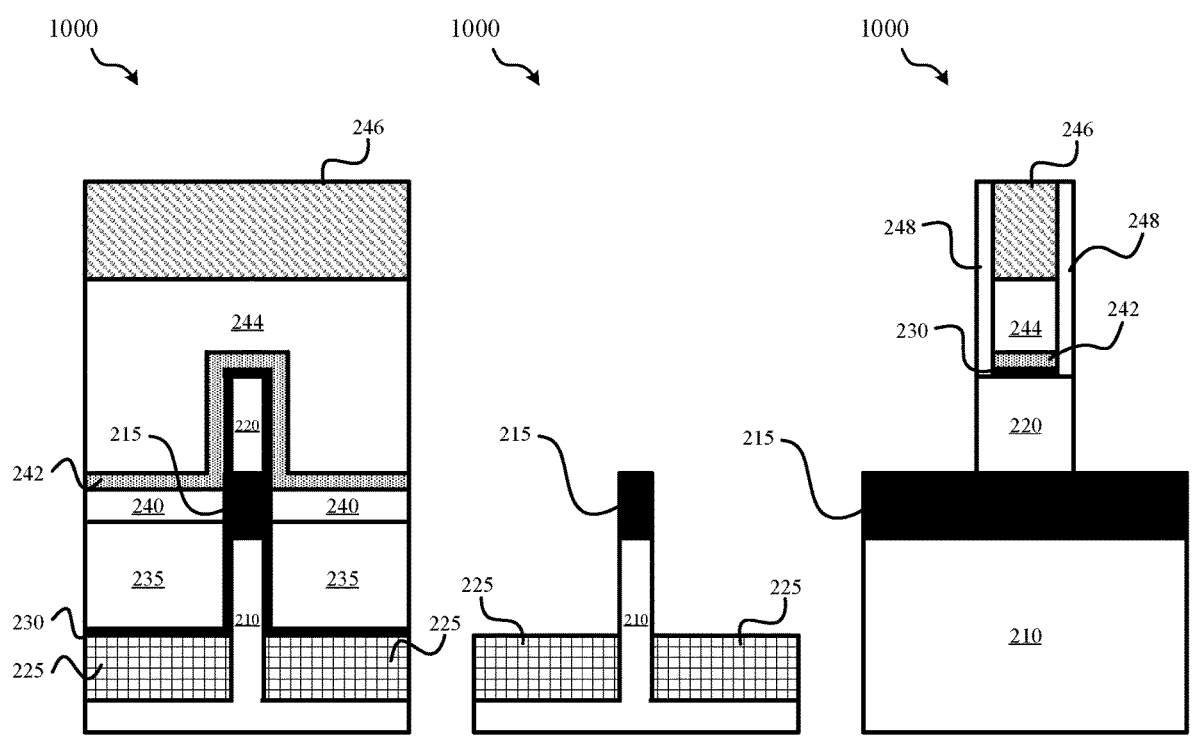
FIG. 10A depicts a first cross-sectional view of an intermediate step for forming stacked FETs with sidewall straps of etching a top portion of the fin, according to some embodiments.
FIG. 10B depicts a second cross-sectional view of an intermediate step for forming stacked FETs with sidewall straps of etching a top portion of the fin, according to some embodiments.
FIG. 10C depicts a third cross-sectional view of an intermediate step for forming stacked FETs with sidewall straps of etching a top portion of the fin, according to some embodiments.

Referring to FIGS. 9A-9C, various cross-sectional views of an intermediate step 900 of forming gate spacers 248 are depicted, according to some embodiments. Gate spacers 248 may also be referred to as first gate spacers 248, herein. First gate spacers 248 may help protect various components (including high-k dielectric 230, etch stop layer 242, and dummy gate 244) from unwanted patterning and etching. In some instances, gate spacers 248 may help provide proper spacing for future etching, such as the removal of excess portions of channel 220 in intermediate step 1000 (FIGS. 10A-10C). In some instances, gate spacers 248 are made of materials such as silicon nitride (SiN), silicon oxynitride (SiON), silicon carbonate (SiCO), silicon boron carbonitride (SiBCN), etc. Gate spacers 248 may be formed through atomic layer disposition (ALD) followed by a directional etch back to remove excess material deposited through the ALD, in some instances.

Referring to FIGS. 10A-10C, various cross-sectional views of an intermediate step 1000 of etching a portion of the channel 220 are depicted, according to some embodiments. As depicted in FIG. 10C, the excess material away from the center portion of the channel 220 may be removed.

FIG. 10B may depict a cross section in the area where the excess portion of the channel 220 was removed, therefore channel 220 may no longer be depicted in FIG. 10B. In some instances, as depicted in FIG. 10C, the etching may occur along the edges of the gate spacers 248. Put differently, the channel 220 may be etched up to the outer edges of the gate spacers 248.

Figure 11A:
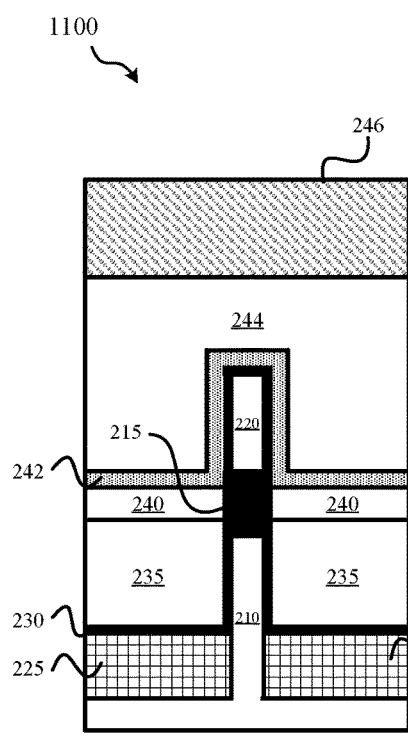
FIG. 11A depicts a first cross-sectional view of an intermediate step for forming stacked FETs with sidewall straps of forming an additional spacer, according to some embodiments.
Figure 11B:
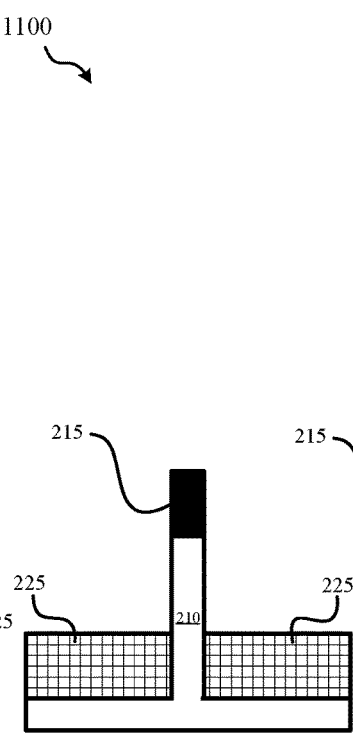
FIG. 11B depicts a second cross-sectional view of an intermediate step for forming stacked FETs with sidewall straps of forming an additional spacer, according to some embodiments.
Figure 11C:
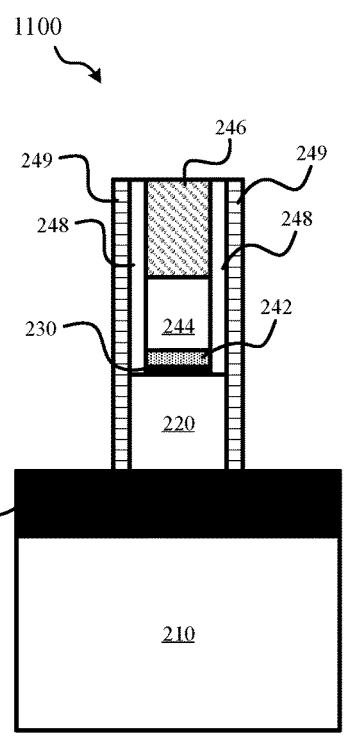
FIG. 11C depicts a third cross-sectional view of an intermediate step for forming stacked FETs with sidewall straps of forming an additional spacer, according to some embodiments.

Referring to FIGS. 11A-11C, various cross-sectional views of an intermediate step 1100 of forming additional gate spacers 249 are depicted, according to some embodiments. Gate spacers 249 may also be referred to herein as second gate spacers 249. The second gate spacers 249 may help protect channel 220 (and other various components) from any unwanted patterning and etching. In some instances, similar to gate spacers 248, second gate spacers 249 may help provide proper spacing/placement for future etching, such as the removal of excess portions of channel 210 in intermediate step 1200 (FIGS. 12A-12C). In some instances, second gate spacers 249 are made of materials such as silicon nitride (SiN), silicon oxynitride (SiON), silicon carbonate (SiCO), silicon boron carbonitride (SiBCN), etc. In some instances, second gate spacers 249 are a different material than first gate spacers 248. In some instances, second gate spacers 249 are a same material as first gate spacers 248.

Referring to FIGS. 12A-12C, various cross-sectional views of an intermediate step 1200 of etching a portion of channel 210 and insulator layer 215 is depicted, according to some embodiments. In some embodiments, channels 210 and 220 along with insulator layer 215 may be referred to collectively as a fin. Therefore, intermediate step 1200 may also be referred to as etching a bottom portion of the fin, in some instances. As depicted in FIG. 12C, the excess material away from the center of channel 210 and insulator layer 215 (i.e., the bottom portion of the fin) may be removed. FIG. 12B may depict a cross section in the area where the excess portion of the channel 210 and insulator layer 215 were removed, therefore channel 210 and insulator layer 215 may no longer be depicted in FIG. 12B. In some instances, as depicted in FIG. 12C, the etching may occur along the edges of the second gate spacers 249. Gate spacers 249 may be formed through atomic layer disposition (ALD) followed by a directional etch back to remove excess material deposited through the ALD, in some instances.

Figure 13A:
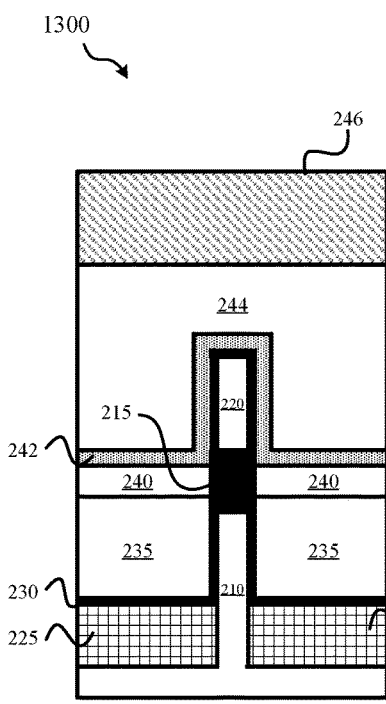
FIG. 13A depicts a first cross-sectional view of an intermediate step for forming stacked FETs with sidewall straps of growing a bottom epi, according to some embodiments.
Figure 13B:
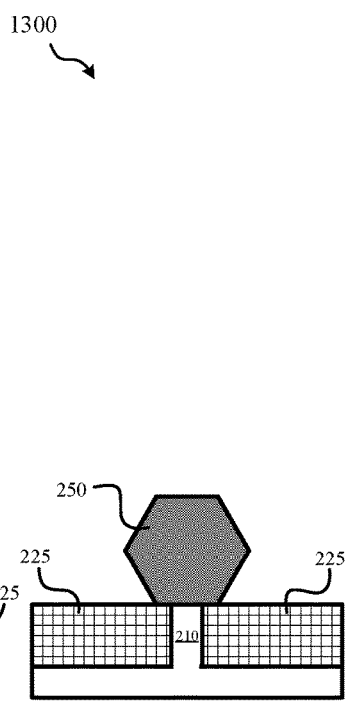
FIG. 13B depicts a second cross-sectional view of an intermediate step for forming stacked FETs with sidewall straps of growing a bottom epi, according to some embodiments.
Figure 13C:
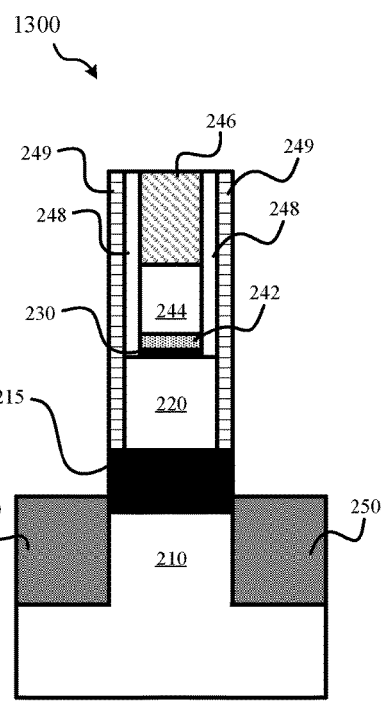
FIG. 13C depicts a third cross-sectional view of an intermediate step for forming stacked FETs with sidewall straps of growing a bottom epi, according to some embodiments.

Referring to FIGS. 13A-13C, various cross-sectional views of an intermediate step 1300 of growing a bottom epitaxial (epi) 250 are depicted, according to some embodiments. An epitaxial/epitaxy (epi) layers may help improve the performance of the transistor(s). Specifically, the epi layers may reduce the resistance (such as contact resistance) of the transistors and/or may have other benefits. The bottom epi 250 may have a crystalline structure and may be a source/drain (S/D) epi in the S/D region of the stacked transistors, in some instances. In some instances, the bottom epi 250 may be made of silicon. The bottom epi 250 may be grown through chemical vapor deposition (CVD), vapor-phase epitaxy (VPE), or any other epi growth technique. Although the bottom epi 250 is depicted in a hexagon cross section shape (as it is likely the bottom epi 250 may be in a hexagonal-like shape due to the nature of epitaxial growth), the bottom epi 250 may not always be in a hexagonal shape.

Figure 14A:
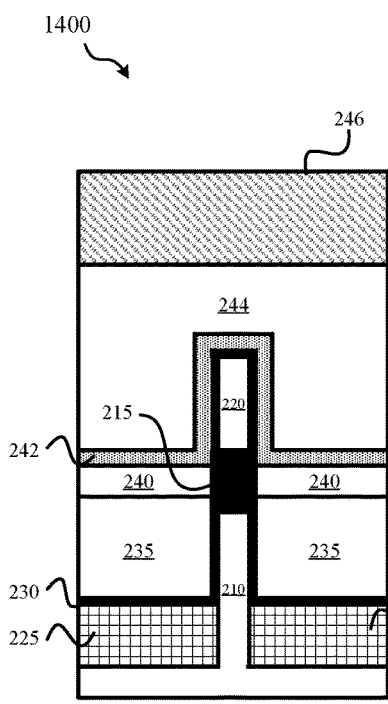
FIG. 14A depicts a first cross-sectional view of an intermediate step for forming stacked FETs with sidewall straps of depositing a sacrificial material, according to some embodiments.
Figure 14B:
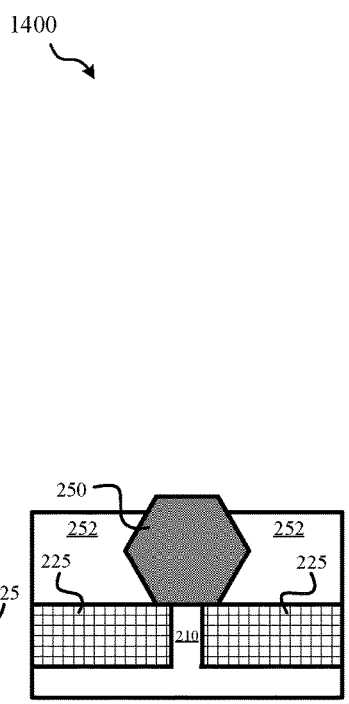
FIG. 14B depicts a second cross-sectional view of an intermediate step for forming stacked FETs with sidewall straps of depositing a sacrificial material, according to some embodiments.
Figure 14C:
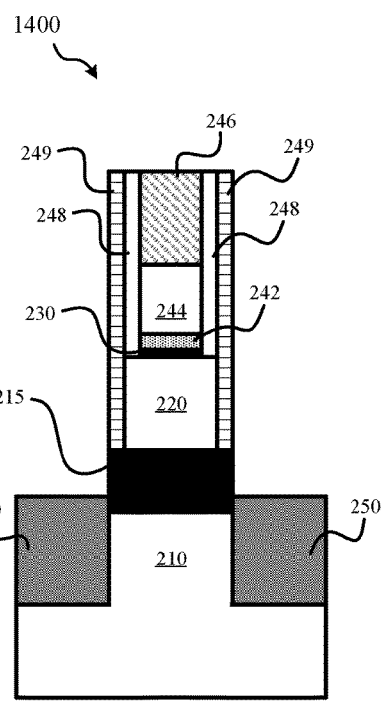
FIG. 14C depicts a third cross-sectional view of an intermediate step for forming stacked FETs with sidewall straps of depositing a sacrificial material, according to some embodiments.

Referring to FIGS. 14A-14C, various cross-sectional views of an intermediate step 1400 of depositing a sacrificial material 252 are depicted, according to some embodiments. The sacrificial material 252 may be deposited/formed around the bottom epi 250, in some instances. This may fill empty space around the bottom epi 250 and may provide a base and/or contact for an isolation layer to be deposited on top of (discussed in intermediate step 1500 (FIGS. 15A-15C)). The sacrificial material 252 may be a material such as silicon germanium (SiGe). In some instances, when the sacrificial material 252 is SiGe, the sacrificial material 252 may introduce (or increase, in some instances) a strain on the channels 210 and/or 220, which may result in better performance of the channels 210 and/or 220. In some instances, the sacrificial material 252 is formed by depositing the sacrificial material 252 and etching back any excess material.

Figure 15A:
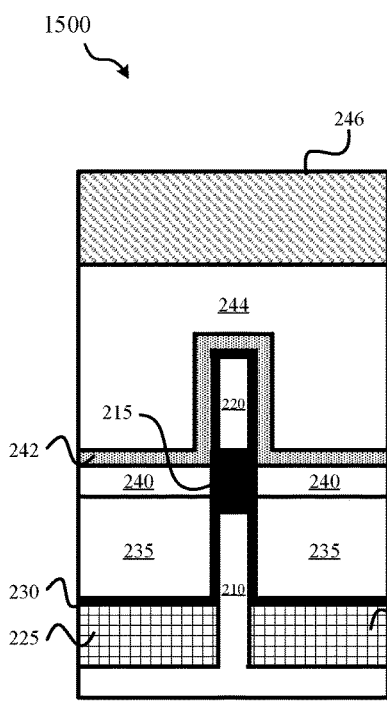
FIG. 15A depicts a first cross-sectional view of an intermediate step for forming stacked FETs with sidewall straps of isolating the bottom epi, according to some embodiments.
Figure 15B:
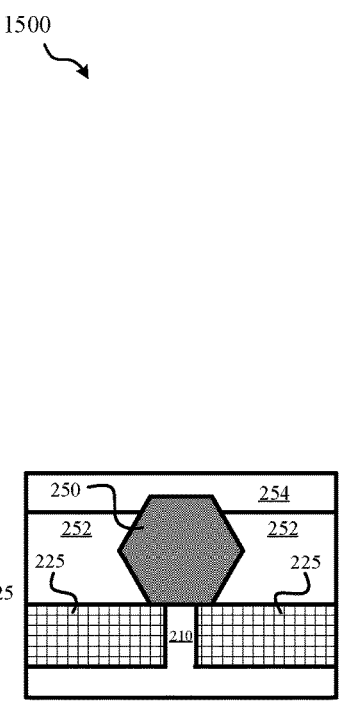
FIG. 15B depicts a second cross-sectional view of an intermediate step for forming stacked FETs with sidewall straps of isolating the bottom epi, according to some embodiments.
Figure 15C:
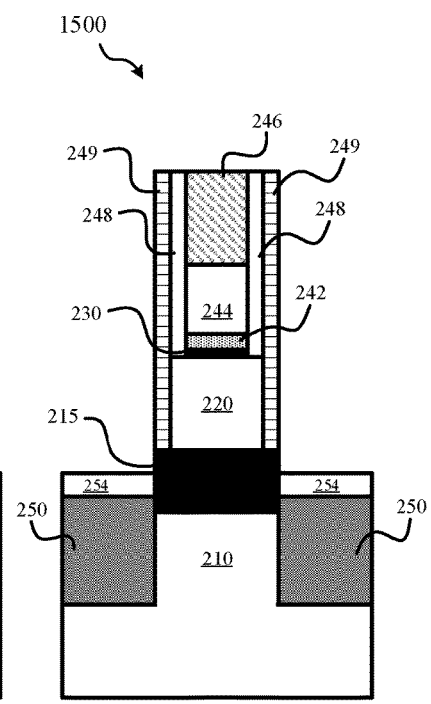
FIG. 15C depicts a third cross-sectional view of an intermediate step for forming stacked FETs with sidewall straps of isolating the bottom epi, according to some embodiments.

Referring to FIGS. 15A-15C, various cross-sectional views of an intermediate step 1500 of isolating the bottom epi 250 are depicted, according to some embodiments. The bottom epi 250 may be isolated through the deposition of an isolation layer 254. Isolation layer 254 may be a material such as SiN, in some instances. As discussed herein, channels 210 and 220 may be channels for two separate transistors that are stacked on top of each other. In some instances, bottom epi 250 may correspond to channel 210 and may be the S/D epi for the bottom transistor. To prevent any negative effects from having S/D epis for two different transistors in close contact with each other, isolation layer 254 is deposited to separate bottom epi 250 from any other epis.

Figures 16A, 16B, 16C:
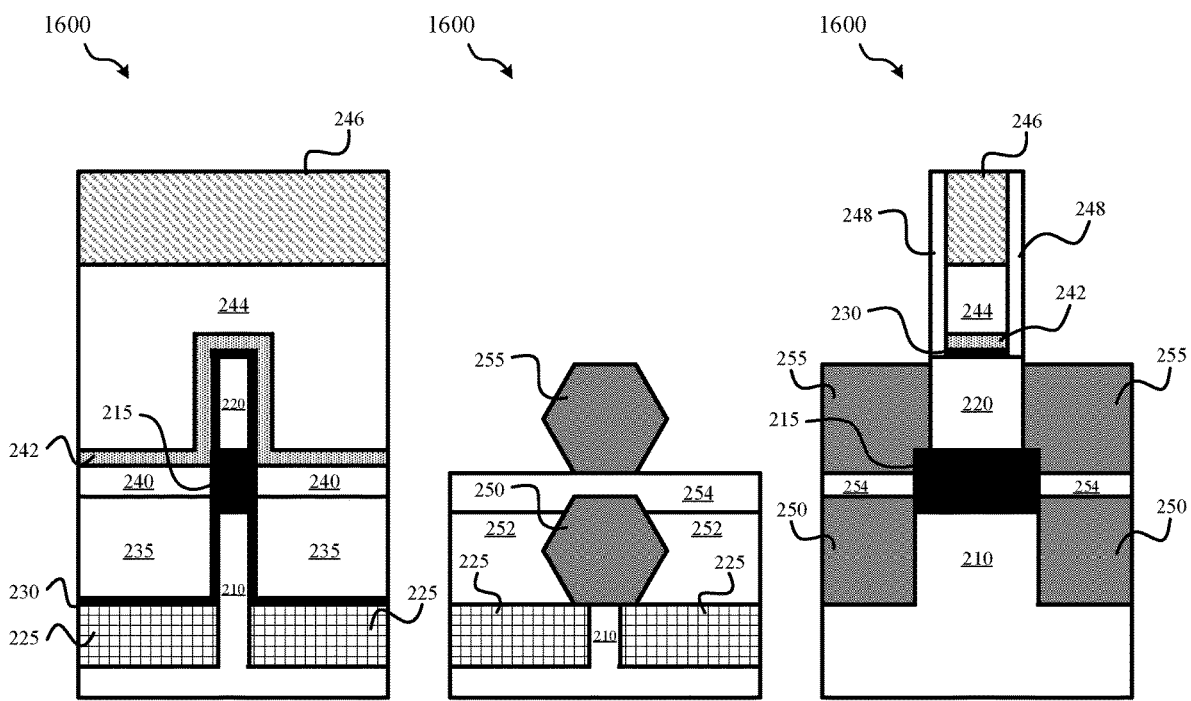
FIG. 16A depicts a first cross-sectional view of an intermediate step for forming stacked FETs with sidewall straps of growing a top epi, according to some embodiments.
FIG. 16B depicts a second cross-sectional view of an intermediate step for forming stacked FETs with sidewall straps of growing a top epi, according to some embodiments.
FIG. 16C depicts a third cross-sectional view of an intermediate step for forming stacked FETs with sidewall straps of growing a top epi, according to some embodiments.

Referring to FIGS. 16A-16C, various cross-sectional views of an intermediate step 1600 of removing second spacers 249 and growing a top epi 255 are depicted, according to some embodiments. In some instances, the second spacers 249 are removed prior to growing the top epi 255 so that the top epi 255 may have direct contact with the channel 220. Top epi 255 may be the S/D epi for the top transistor (i.e., the transistor corresponding to channel 220) in some instances. In some instances, the top epi 250 may be made of silicon. The top epi 250 may be grown through chemical vapor deposition (CVD), vapor-phase epitaxy (VPE), or any other epi growth technique.

Figures 17A, 17B, 17C:
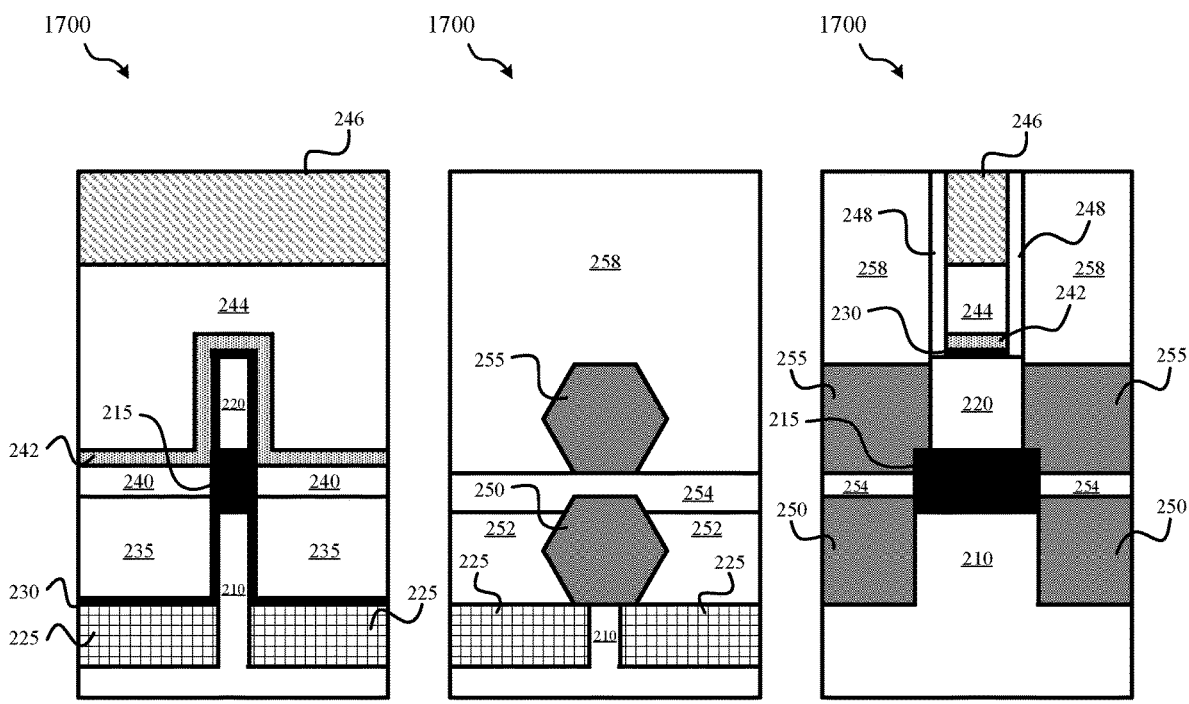
FIG. 17A depicts a first cross-sectional view of an intermediate step for forming stacked FETs with sidewall straps of filling the intermediate stacked FETs with ILD, according to some embodiments.
FIG. 17B depicts a second cross-sectional view of an intermediate step for forming stacked FETs with sidewall straps of filling the intermediate stacked FETs with ILD, according to some embodiments.
FIG. 17C depicts a third cross-sectional view of an intermediate step for forming stacked FETs with sidewall straps of filling the intermediate stacked FETs with ILD, according to some embodiments.

Referring to FIGS. 17A-17C, various cross-sectional views of an intermediate step 1700 of filling the intermediate stacked FETs with interlayer dielectric (ILD) 258 are depicted, according to some embodiments. ILD 258 may be a dielectric such as $SiO_2$ or any other dielectric with a relatively low dielectric constant (k). ILD 258 may be used to separate the components of the stacked transistors with any other components of the chip, integrated circuit, and/or the computer system. The stacked transistors may be in close contact with other components, and the ILD 258 may prevent any unwanted heat transfer and/or electric transfer between components.

Figures 18A, 18B, 18C:
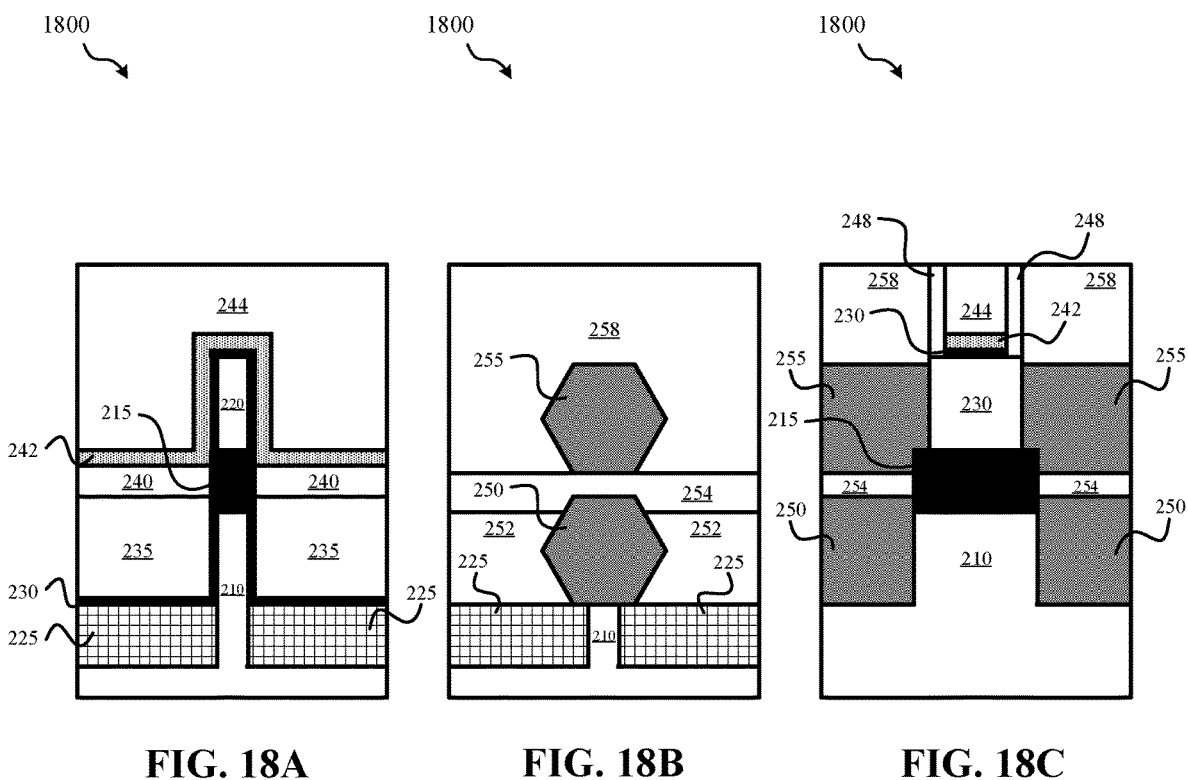
FIG. 18A depicts a first cross-sectional view of an intermediate step for forming stacked FETs with sidewall straps of polishing and removing excess material, according to some embodiments.
FIG. 18B depicts a second cross-sectional view of an intermediate step for forming stacked FETs with sidewall straps of polishing and removing excess material, according to some embodiments.
FIG. 18C depicts a third cross-sectional view of an intermediate step for forming stacked FETs with sidewall straps of polishing and removing excess material, according to some embodiments.

Referring to FIGS. 18A-18C, various cross-sectional views of an intermediate step 1800 of polishing and removing excess material are depicted, according to some embodiments. Specifically, intermediate step 1800 includes removing hard mask 246 as well as portions of gate spacers 248 and ILD 258. The polishing and removing may include removing all materials and portions of materials at the height of the hard mask 246 (i.e., above the height of dummy gate 244). In some instances, CMP is used to remove hard mask 246 and the excess portions of gate spacers 248 and ILD 258.

Figure 19A:
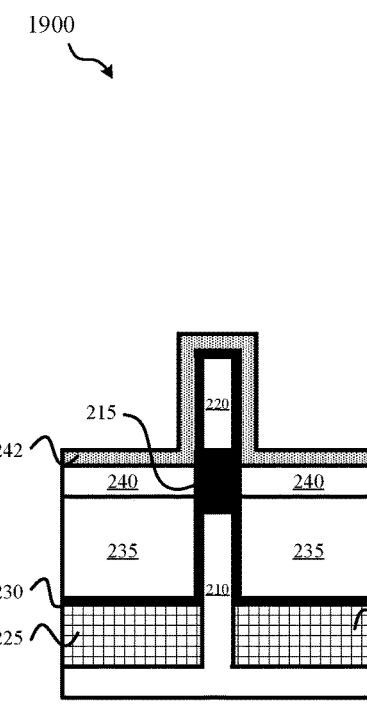
FIG. 19A depicts a first cross-sectional view of an intermediate step for forming stacked FETs with sidewall straps of removing the dummy gate materials, according to some embodiments.
Figure 19B:
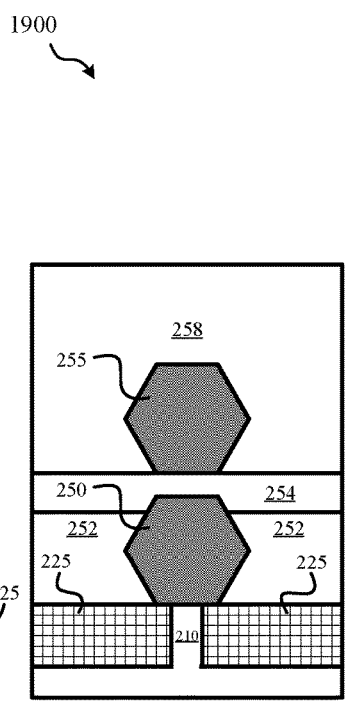
FIG. 19B depicts a second cross-sectional view of an intermediate step for forming stacked FETs with sidewall straps of removing the dummy gate materials, according to some embodiments.
Figure 19C:
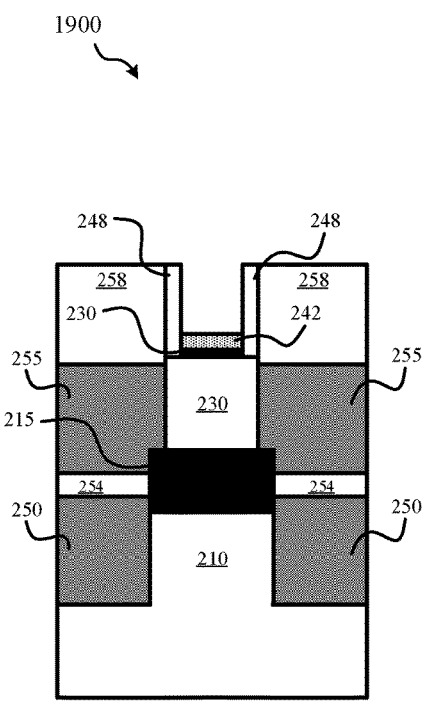
FIG. 19C depicts a third cross-sectional view of an intermediate step for forming stacked FETs with sidewall straps of removing the dummy gate materials, according to some embodiments.

Referring to FIGS. 19A-19C, various cross-sectional views of an intermediate step 1900 of removing the remaining dummy gate materials 244 are depicted, according to some embodiments. The dummy gate 244 served as a placeholder for the second gate, but may now be removed in order to make room for the second gate (which may be deposited in step 2100 (FIGS. 21A-21C)). In some instances, removing the dummy gate 244 may include performing an etching process until the etch stop layer 242 is reached. The etch stop layer 242 may serve as a marker on when to stop etching and may also protect dielectric layer 240 from any unwanted etching. Further, as depicted in FIG. 19C, the etching/removal process may only occur in a middle portion of the stacked transistors between spacers 248.

Figure 20A:
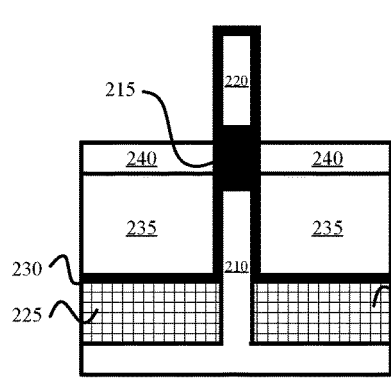
FIG. 20A depicts a first cross-sectional view of an intermediate step for forming stacked FETs with sidewall straps of removing the etch stop material, according to some embodiments.
Figure 20B:
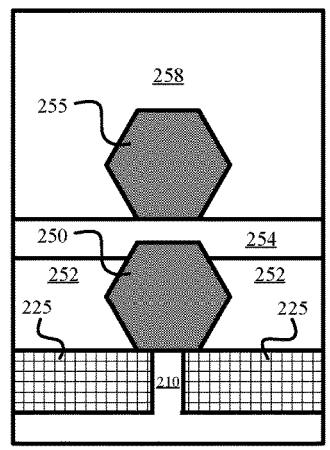
FIG. 20B depicts a second cross-sectional view of an intermediate step for forming stacked FETs with sidewall straps of removing the etch stop material, according to some embodiments.
Figure 20C:
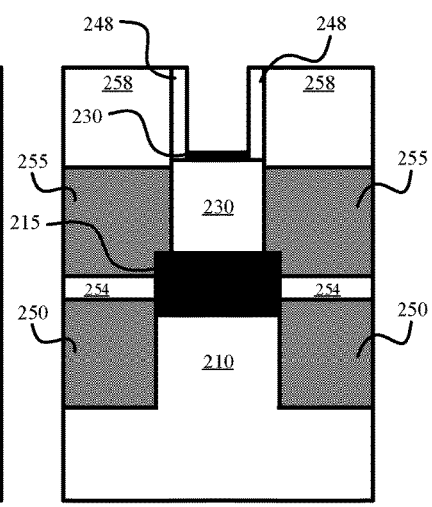
FIG. 20C depicts a third cross-sectional view of an intermediate step for forming stacked FETs with sidewall straps of removing the etch stop material, according to some embodiments.

Referring to FIGS. 20A-20C, various cross-sectional views of an intermediate step 2000 of removing the etch stop material 242 are depicted, according to some embodiments. As the etching process to remove dummy gate 244 has now been completed, etch stop material 242 may no longer be needed and may be removed. The etch stop material 242 may be removed through RIE, CMP, or any other removal technique.

Figures 21A, 21B, 21C:
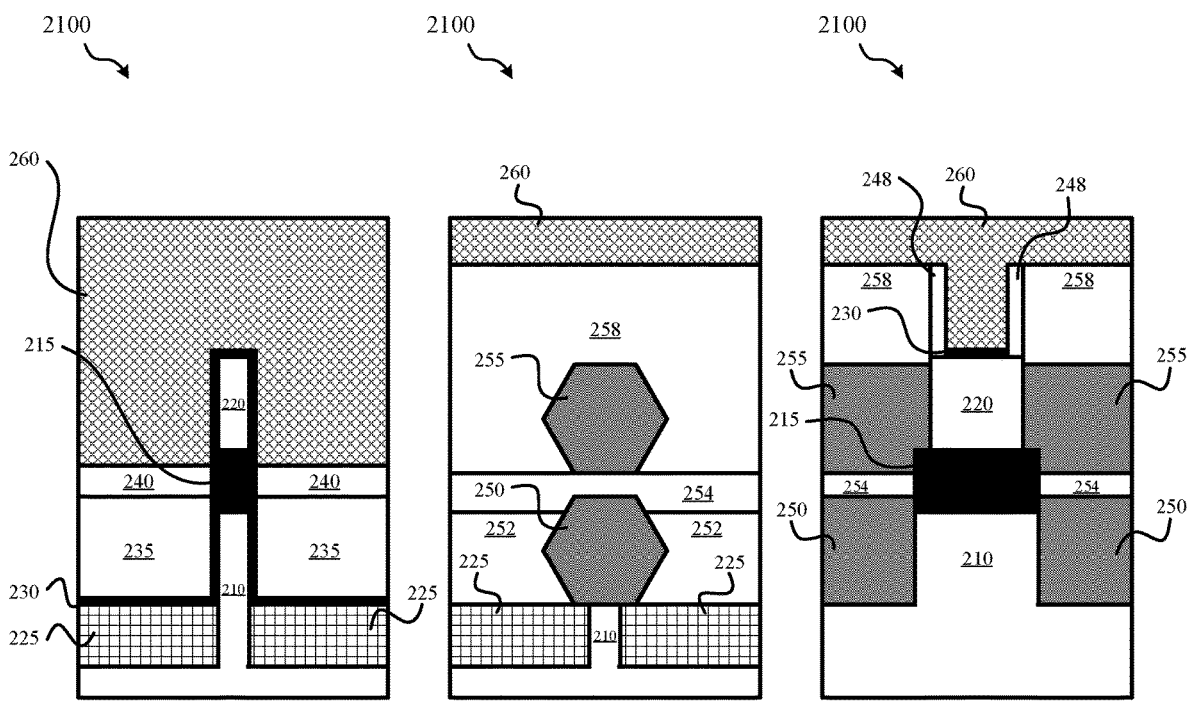
FIG. 21A depicts a first cross-sectional view of an intermediate step for forming stacked FETs with sidewall straps of depositing a second metal, according to some embodiments.
FIG. 21B depicts a second cross-sectional view of an intermediate step for forming stacked FETs with sidewall straps of depositing a second metal, according to some embodiments.
FIG. 21C depicts a third cross-sectional view of an intermediate step for forming stacked FETs with sidewall straps of depositing a second metal, according to some embodiments.

Referring to FIGS. 21A-21C, various cross-sectional views of an intermediate step 2100 of depositing a second metal 260 are depicted, according to some embodiments. Second metal 260 may also be referred to herein as second gate(s) 260, as second metal 260 will become second gate 260. Second metal 260, or second gate 260, may be the gate for the top transistor that corresponds with channel 220. Second metal 260 may be TiN, TiAlC, etc. In some instances, second metal 260 is a combination of metals, such as a combination of TiN and TiAlC for example. In some instances, both first metal 235 and second metal 260 may be combinations of TiN and TiAlC, however each metal (235 and 260) may have different compositions and/or thicknesses of each material (TiN and TiAlC). Second metal 260 may be deposited through ALD, CVD, LCVD, or any other applicable deposition technique.

Figure 22A:
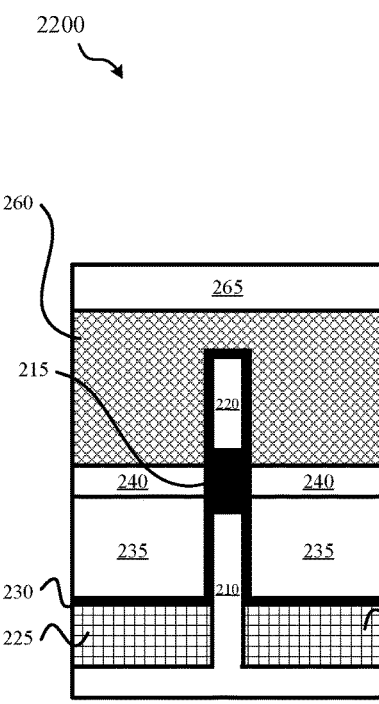
FIG. 22A depicts a first cross-sectional view of an intermediate step for forming stacked FETs with sidewall straps of depositing a dielectric on top of the second metal, according to some embodiments.
Figure 22B:
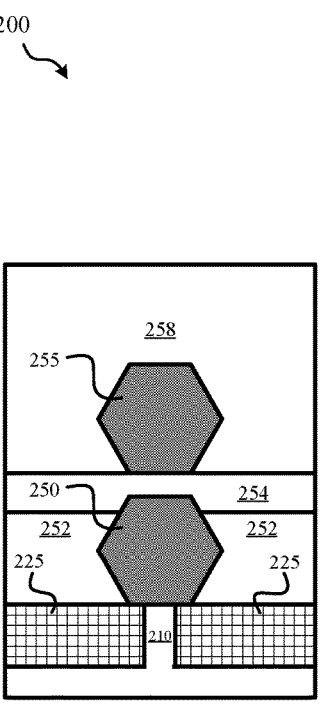
FIG. 22B depicts a second cross-sectional view of an intermediate step for forming stacked FETs with sidewall straps of depositing a dielectric on top of the second metal, according to some embodiments.
Figure 22C:
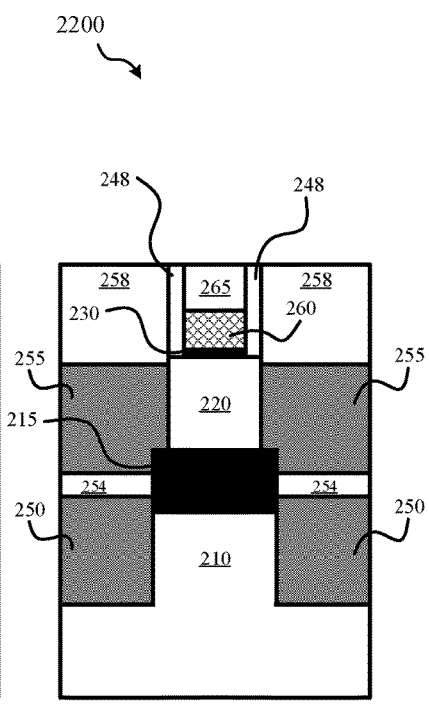
FIG. 22C depicts a third cross-sectional view of an intermediate step for forming stacked FETs with sidewall straps of depositing a dielectric on top of the second metal, according to some embodiments.

Referring to FIGS. 22A-22C, various cross-sectional views of an intermediate step 2200 of depositing a dielectric 265 on top of the second metal 260 are depicted, according to some embodiments. In some instances, intermediate step 2200 may include removing excess second metal 260 (or recessing second metal 260) prior to depositing the dielectric 265. Dielectric 265 may act as a cap on top of second metal 260 and may protect second metal 260 from any unwanted contact, heat transfer, etc. Because of this, dielectric 265 may also be referred to as dielectric cap 265, herein. The excess metal 260 may be removed through RIE, CMP, or any other applicable removal technique. Dielectric cap 265 may be deposited through ALD, CVD, LCVD, etc.

Figure 23A:
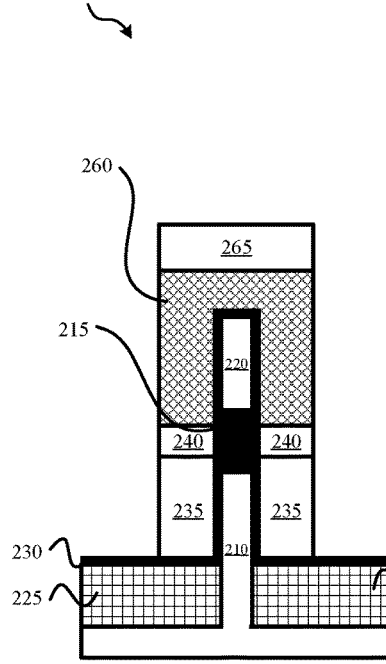
FIG. 23A depicts a first cross-sectional view of an intermediate step for forming stacked FETs with sidewall straps of cutting excess gate material, according to some embodiments.
Figure 23B:
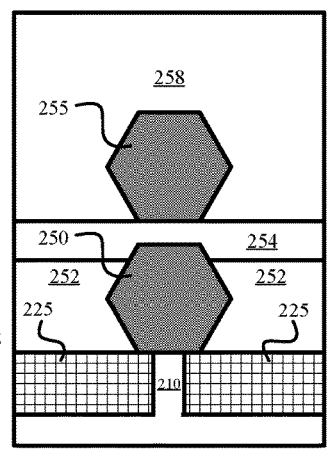
FIG. 23B depicts a second cross-sectional view of an intermediate step for forming stacked FETs with sidewall straps of cutting excess gate material, according to some embodiments.
Figure 23C:
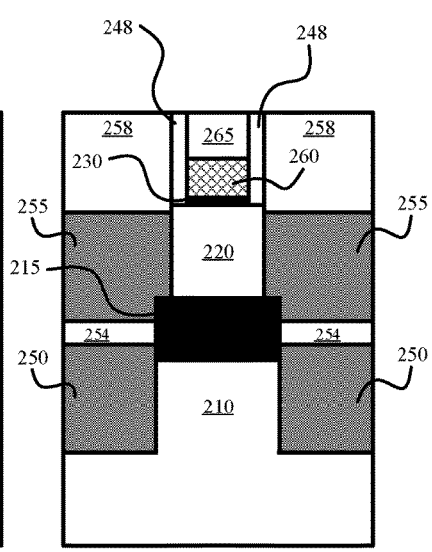
FIG. 23C depicts a third cross-sectional view of an intermediate step for forming stacked FETs with sidewall straps of cutting excess gate material, according to some embodiments.

Referring to FIGS. 23A-23C, various cross-sectional views of an intermediate step 2300 of cutting/removing excess gate material are depicted, according to some embodiments. In some instances, as depicted in FIG. 23A, only a middle/central portion of the gates 235 and 260 may be needed, and the gates 235 and 260 may not need to extend the same width as dielectric 225. Therefore, the outside portions of first metal (i.e., first gate) 235 and second metal (i.e., second gate) 260 may be removed in intermediate step 2300. Further, the corresponding outside portions of dielectric layer 240 may also be removed. Removing the excess/outside portions of first gate 235, second gate 260, and dielectric layer 240 may be done through a gate cut process, an etching process, or any other removal process. In some instances, the depositing of the second metal (from intermediate step 2100) and the removal of excess gate material for the second metal (from intermediate step 2300) may be referred to collectively as forming the second gate, as these steps may put the second metal in condition to act as a second gate. Similarly, the depositing of the first metal (from intermediate step 400), the recessing of the first metal (from intermediate step 500), and the removal of excess gate material for the first metal (from intermediate step 2300) may be referred to collectively as forming the first gate.

Figure 24:
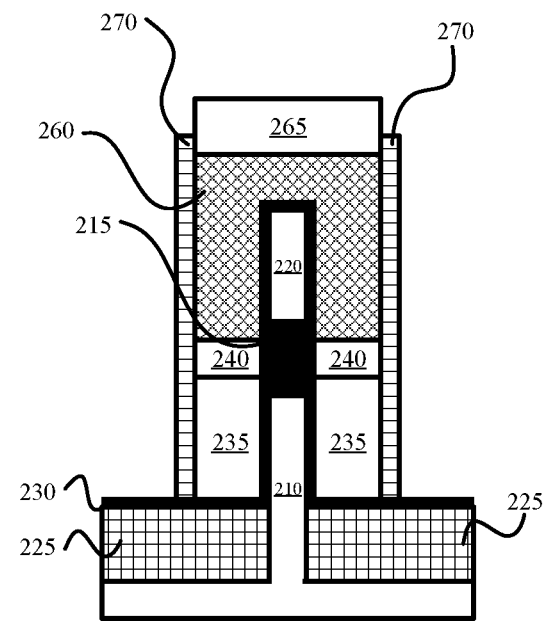
FIG. 24 depicts an intermediate step for forming stacked FETs of forming the sidewall straps, according to some embodiments.

FIG. 24 depicts an intermediate step 2400 of forming the sidewall straps 270, according to some embodiments. Although B and C views of this operation are not depicted, the B and C views may correspond to FIG. 23B and FIG. 23C, respectively. In some instances, the sidewall straps 270 may be a metal material such as TiN, tungsten (W), or any other metal material. By forming sidewall straps 270, first gate 235 and second gate 260 may be connected to each other through the sidewall straps 270 without having a direct connection between the gates 235 and 260 (as they are separated by dielectric layer 240). This may help prevent gate 235 and gate 260 from negatively effecting each other from close proximity and direct contact while still maintaining a connection between the two gates 235 and 260 when desired.

In some instances, forming sidewall straps 270 may include depositing the metal material, for instance through conformal metal deposition, and then removing any excess material that was deposited. Removing the excess material may be done through RIE or other removal techniques.

Figure 25:
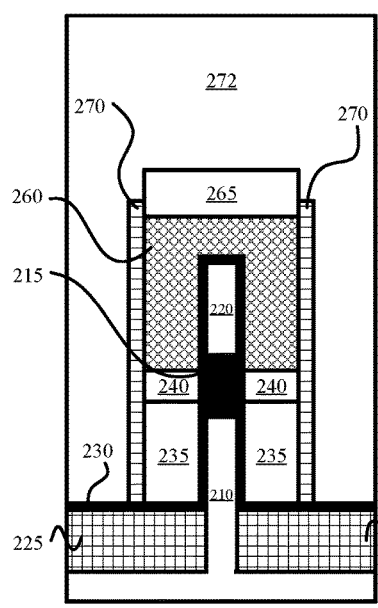
FIG. 25 depicts a first example intermediate stacked FET with both sidewall straps protected from removal, according to some embodiments.
Figure 26:
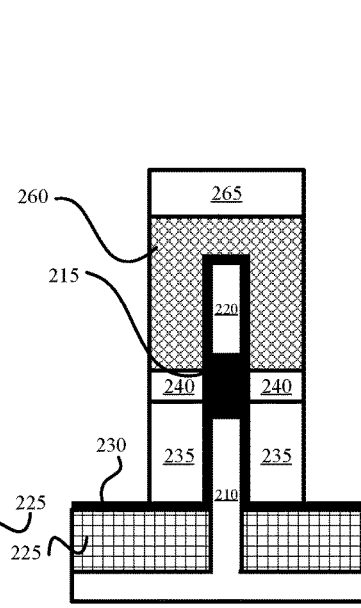
FIG. 26 depicts a second example intermediate stacked FET with both sidewall straps removed, according to some embodiments.
Figure 27:
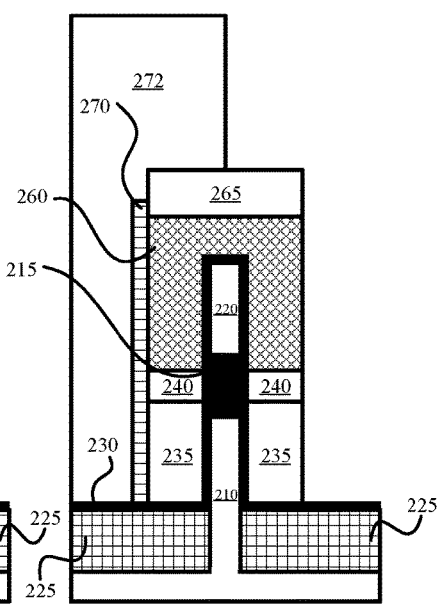
FIG. 27 depicts a third example intermediate stacked FET with one sidewall strap protected from removal, according to some embodiments.

FIGS. 25-27 depicts three exemplary intermediate stacked FETs with different sidewall strap configurations. In some instances, multiple stacked transistors may be included on the same chip and/or within the same system. Further, in some instances, these multiple stacked transistors may be formed at the same/similar times. Intermediate stacked FETs 2500, 2600, and 2700 (from FIG. 25, FIG. 26, and FIG. 27, respectively) show different masking techniques in order to achieve different sidewall strap configurations on the same chip and/or within the same system. For example, the same chip may include double strapped stacked FETs (such as intermediate stacked FETs 2500), non-strapped stacked FETs (such as intermediate stacked FETs 2600), and/or single strapped stacked FETs (such as intermediate stacked FETs 2700). When chips and/or systems include different strap configurations, one or more sidewall straps may need to be removed on one or more of the stacked transistors.

Figure 28:
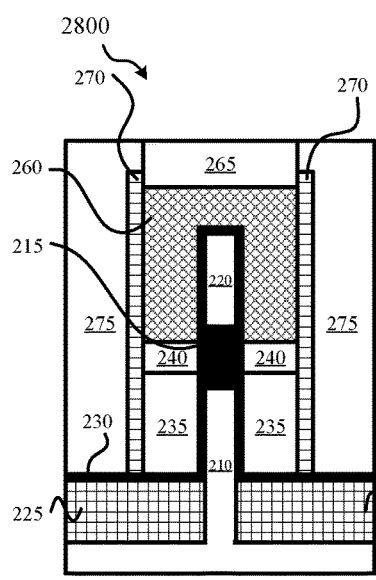
FIG. 28 depicts an example double strapped stacked FET, according to some embodiments.

FIG. 25 depicts a first example intermediate stacked FET 2500 with both sidewall straps protected from removal, according to some embodiments. In some instances, only stacked transistors (such as stacked FETs) with both sidewalls 270 may be included on a chip. In these instances, there may be no removal of unwanted sidewalls, and the formation process may go directly from intermediate step 2400 (FIG. 24) to fully formed double strapped stacked FET 2800 (FIG. 28).

However, when different sidewall configurations for stacked FETs occur on a same chip and/or system, intermediate step 2400 (FIG. 24) may proceed to intermediate stacked FETs 2500 when there is a desired double sidewall configuration. In intermediate stacked FETs 2500, a mask 272 (such as an organic planarization layer (OPL)) may be formed surrounding both sidewall straps 270. In some instances, intermediate stacked FETs 2500 are depicted after a removal process such as lithography is executed to remove any unwanted sidewalls. By forming/depositing mask 272 surrounding the sidewall straps 270, both sidewall straps 270 remain intact for intermediate stacked FETs 2500. This may result in stacked transistors with a double sidewall strap configuration.

FIG. 26 depicts a second example intermediate stacked FETs 2600 with both sidewall straps removed, according to some embodiments. In some instances, it may be desired to have one or more stacked transistors with no connection between the gates 235 and 260 of each transistor (as the gates 235 and 260 are separated by dielectric layer 240). For instance, it may be desired to have a chip with multiple sets of stacked transistors, however it may be desirable to only have some of these stacked transistors with sidewall strap(s) whereas other stacked transistors on the chip may have no sidewalls. Therefore, in these instances, for one or more stacked transistors on a chip (or in a system), it may not be desired to have any sidewall straps 270 connecting the two gates 235 and 260. To remove sidewall straps 270 from stacked FETs, there may be no masking done to the stacked FETs 2600. This way, when a removal process (such as lithography) is executed to remove unwanted sidewalls, both sidewall straps 270 may be removed from intermediate stacked FETs 2600. FIG. 26 may depict intermediate stacked FETs 2600 after their sidewall straps 270 have been removed.

FIG. 27 depicts a third example intermediate stacked FETs with one sidewall strap protected from removal, according to some embodiments. In some instances, it may be desired to have some connection between the two stacked transistors without having a full connection. In these instances, a single sidewall strap 270 to connect gate 235 and 260 may be desired. To form stacked FETs with a single sidewall strap, one sidewall strap 270 may be protected/masked by mask 272, as depicted in FIG. 27. This way, only one of the two sidewall straps 270 is protected from removal. Once sidewall strap removal has occurred, as depicted in intermediate stacked FETs 2700, the unmasked sidewall strap has been removed from the stacked FETs 2700 and only a single sidewall strap 270 remains.

The masking process depicted in FIGS. 25-27 may occur when multiple different strap configurations (e.g., double strapped, single strapped, and/or non-strapped) occur within the same chip and/or system. When only double strapped stacked transistors occur within a chip and/or system, the formation process may go directly from step 2400 (FIG. 24) to fully formed stacked transistors 2600 (FIG. 26).

Figure 29:
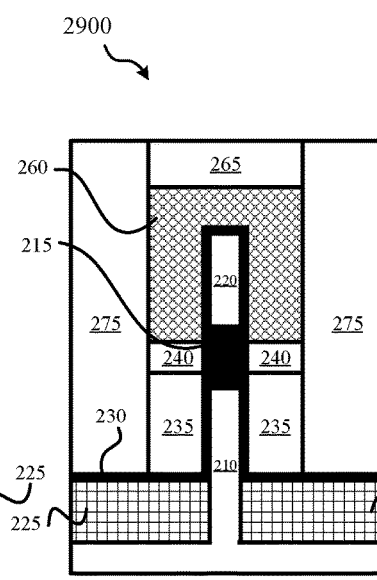
FIG. 29 depicts an example non-strapped stacked FET, according to some embodiments.
Figure 30:
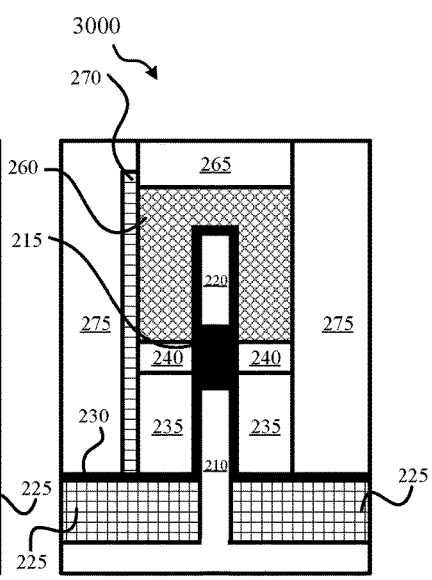
FIG. 30 depicts an example single strapped stacked FET, according to some embodiments.

Referring now to FIGS. 28-30, fully formed stacked FETs are depicted, according to some embodiments. Stacked FETs 2800 (FIG. 28) may be a set of double strapped stacked FETs, stacked FETs 2900 (FIG. 29) may be a set of non-strapped stacked FETs, and stacked FETs 3000 (FIG. 30) may be a set of single strapped stacked FETs. In some instances, one or more of these stacked transistors with different strap configurations may exist on the same chip and/or within the same system. For example, a same computer chip may include double strapped stacked FETs 2800 and non-strapped stacked FETs 2900. In another example, a same computer chip may include double strapped stacked FETs 2800 and single strapped stacked FETs 3000. In yet another example, a same computer chip may include double strapped stacked FETs 2800, non-strapped stacked FETs 2900, and single strapped stacked FETs 3000. Although not depicted, FIGS. 28-30 may include B and C views very similar to FIGS. 23B and 23C, respectively. Put differently, although only the A cross section is depicted in FIGS. 28-30, stacked FETs 2800, 2900, and 3000 may still include components such as bottom epi 250, top epi 255, gate spacers 248, and ILD 258 (depicted in FIGS. 23B and 23C).

FIG. 28 depicts an example set of double strapped stacked FET, according to some embodiments. Once the sidewall straps are formed (FIG. 24) and/or once the mask 272 is removed from intermediate stacked FETs 2500, a dielectric 275 may be deposited next to the sidewall straps 270. Dielectric 275 may protect the sidewall straps 270 (and any other components such as gates 260 and 235) and may prevent unwanted heat and/or electric transfer. Once the dielectric is 275 is deposited, the double strapped stacked FETs 2800 may be considered fully formed. Double strapped stacked FETs 2800 includes a bottom FET (with gate 235 and channel 210) and a top FET (with gate 260 and channel 220) connected by sidewall straps 270.

FIG. 29 depicts an example set of non-strapped stacked FETs 2900, according to some embodiments. Once the unwanted sidewall straps are removed (as depicted in intermediate stacked FETs 2600 (FIG. 26), dielectric 275 may be deposited to protect gates 235 and 260 and prevent unwanted exposure. Non-strapped stacked FETs 2900 include the bottom transistor and top transistor with no connection between the corresponding gates 235 and 260, as the gates are separated by layer 240 and are not connected through any sidewall straps.

FIG. 30 depicts example single strapped stacked FETs, according to some embodiments. Once one of the two sidewall straps has been removed (as depicted in intermediate stacked FETs 2700 (FIG. 27), dielectric 275 may be deposited to protect sidewall strap 270 and gates 235 and 260 and prevent unwanted exposure. Single strapped stacked FETs 3000 include the bottom transistor and top transistor with only a single sidewall strap 270 connecting the two gates 235 and 260, respectively.

Figure 31:
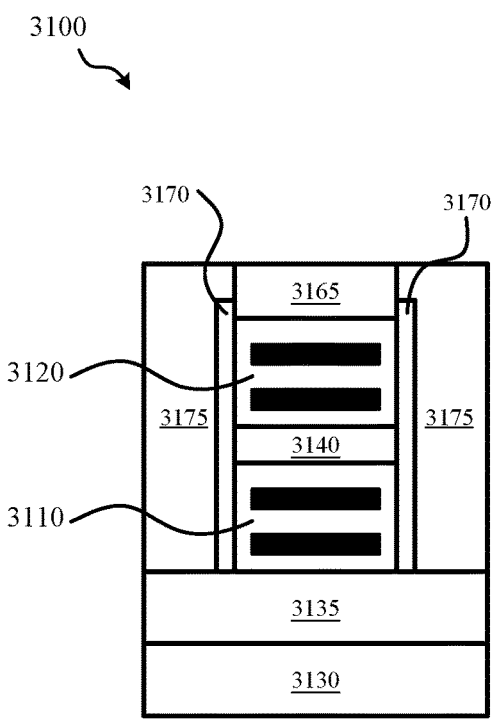
FIG. 31 depicts stacked nanosheets with sidewall straps, according to some embodiments.

In some instances, the stacked transistors with sidewall straps configuration and/or the same/similar steps of forming stacked transistors (described in FIGS. 1-30) may be used with other types of components or transistors. For instance, FIG. 31 depicts stacked nanosheet transistors 3100 with sidewall straps, according to some embodiments. Although the sidewall straps have been discussed herein in relation to stacked FETs, sidewall straps may also be used to connect stacked nanosheets, such as nanosheet transistors. Stacked nanosheets 3100 include a substrate 3130 and an oxide 3135. A bottom nanosheet transistor 3110 may be formed on top of the oxide 3135, in some instances. To prevent negative effects from direct contact between nanosheets and gates of the nanosheets, a dielectric layer 3140 may be deposited to separate nanosheet transistor 3110. A second nanosheet transistor 3120 may be formed on top of the dielectric layer 3140. Sidewall straps 3170 may be metal straps used to connect the nanosheet transistors 3110 and 3120. Stacked nanosheet transistors 3100 may also include dielectric 3175 and dielectric cap 3165 to protect the various components of the stacked nanosheet transistors 3100.

Figure 32:
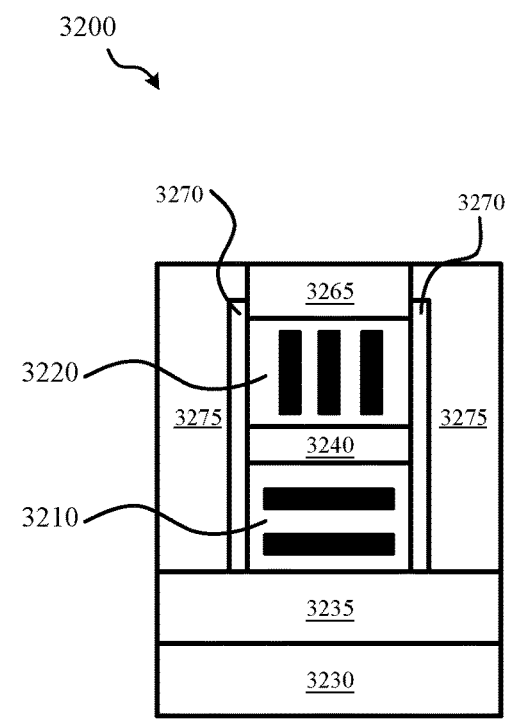
FIG. 32 depicts stacked hybrid FETs with sidewall straps, according to some embodiments.

FIG. 32 depicts stacked hybrid FETs 3200 with sidewall straps, according to some embodiments. Hybrid FETs 3200 may be a set of different types of transistors. Put differently, transistor 3210 and 3270 may be different types of transistors or FETs. Although the sidewall straps have been discussed herein in relation to stacked FETs and stacked transistors, sidewall straps may also be used to connect transistors in stacked hybrid FETs. Stacked hybrid FETs 3200 include a substrate 3230 and an oxide 3235. A first transistor (i.e., bottom transistor) 3210 may be formed on top of the oxide 3235, in some instances. To prevent negative effects from direct contact between gates and transistors, a dielectric layer 3240 may be deposited to separate transistor 3210. A second transistor (i.e., top transistor) 3220 may be formed on top of the dielectric layer 3240. Sidewall straps 3270 may be metal straps used to connect the transistors 3210 and 3220. Stacked hybrid FETs 3200 may also include dielectric 3275 and dielectric cap 3265 to protect the various components of the stacked nanosheets 3200. In some instances, first transistor 3210 may be a nanosheet transistor and second transistor 3220 may be another type of FET transistor, or vice versa.

Figure 33:
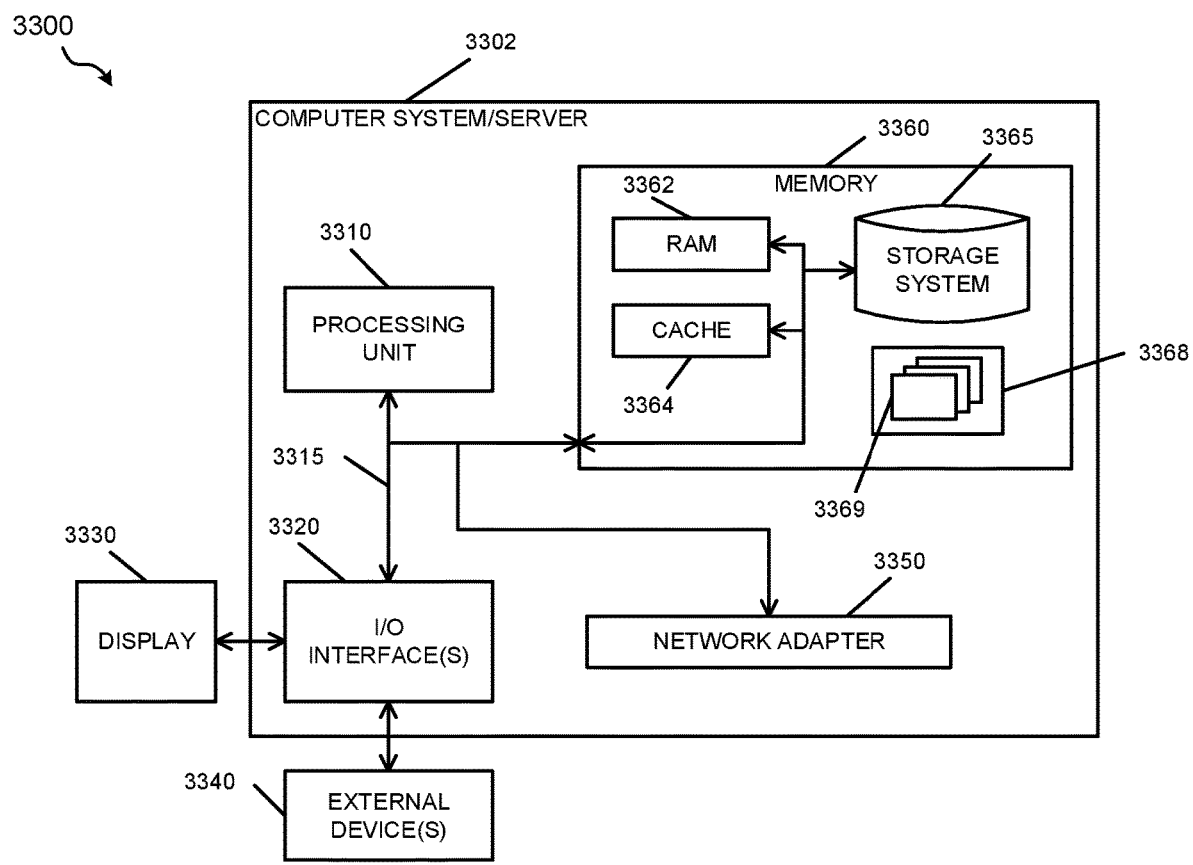
FIG. 33 depicts a block diagram of a sample computer system, according to some embodiments.

Referring to FIG. 33, computer system 3300 is a computer system/server 3302 is shown in the form of a general-purpose computing device, according to some embodiments. In some instances, double strapped stacked FETs 100 (FIG. 1), double strapped stacked FETs 2800 (FIG. 28), non-strapped stacked FETs 2900 (FIG. 29), single strapped stacked FETs 3000 (FIG. 30), stacked nanosheets 3100 (FIG. 31), and/or stacked hybrid FETs 3200 (FIG. 32) may be a part of computer system 3300 and/or computer system/server 3302. The components of computer system/server 3302 may include, but are not limited to, one or more processors or processing units 3310, a system memory 3360, and a bus 3315 that couples various system components including system memory 3360 to processor 3310.

Bus 3315 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 3302 typically includes a variety of computer system readable media. Such media may be any available media that is accessible by computer system/server 3302, and it includes both volatile and non-volatile media, removable and non-removable media.

System memory 3360 can include computer system readable media in the form of volatile memory, such as random-access memory (RAM) 3362 and/or cache memory 3364. Computer system/server 3302 may further include other removable/non-removable, volatile/non-volatile computer system storage media. By way of example only, storage system 3365 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 3315 by one or more data media interfaces. As will be further depicted and described below, memory 3360 may include at least one program product having a set (e.g., at least one) of program modules that are configured to carry out the functions of embodiments of the disclosure.

Program/utility 3368, having a set (at least one) of program modules 3369, may be stored in memory 3360 by way of example, and not limitation, as well as an operating system, one or more application programs, other program modules, and program data. Each of the operating system, one or more application programs, other program modules, and program data or some combination thereof, may include an implementation of a networking environment. Program modules 3369 generally carry out the functions and/or methodologies of embodiments of the invention as described herein.

Computer system/server 3302 may also communicate with one or more external devices 3340 such as a keyboard, a pointing device, a display 3330, etc.; one or more devices that enable a user to interact with computer system/server 3302; and/or any devices (e.g., network card, modem, etc.) that enable computer system/server 3302 to communicate with one or more other computing devices. Such communication can occur via Input/Output (I/O) interfaces 3320. Still yet, computer system/server 3302 can communicate with one or more networks such as a local area network (LAN), a general wide area network (WAN), and/or a public network (e.g., the Internet) via network adapter 3350. As depicted, network adapter 3350 communicates with the other components of computer system/server 3302 via bus 3315. It should be understood that although not shown, other hardware and/or software components could be used in conjunction with computer system/server 3302. Examples include, but are not limited to: microcode, device drivers, redundant processing units, external disk drive arrays, RAID systems, tape drives, and data archival storage systems, etc.

The present invention may be a system, a method, a computer program product, etc. at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electronic signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object orientated program language such as Smalltalk, C++, or the like, and procedural programming languages, such as the "C" programming language or similar programming languages. The computer readable program instructions may execute entirely one the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A set of stacked transistors, the stacked transistors comprising:
   a first transistor comprising a first gate;
   a second transistor comprising a second gate, wherein the second transistor is above the first transistor;
   a dielectric preventing direct contact between the first gate and the second gate; and
   a first sidewall strap directly connected to the first gate and to the second gate to provide an electrical path between the first gate and the second gate, wherein the first sidewall strap connects the first transistor and the second transistor.

2. The stacked transistors of claim 1, further comprising:
   a second sidewall strap connecting the first transistor and the second transistor, wherein:
      the first sidewall strap is directly connected to a first side of the first gate and a first side of the second gate, and
      the second sidewall strap is directly connected to a second side of the first gate and a second side of the second gate.

3. The stacked transistors of claim 1, wherein the first sidewall strap is a metal strap including at least one of TiN and W.

4. The stacked transistors of claim 1, wherein:
   the first transistor comprises a first channel; and
   the second transistor comprises a second channel.

5. The stacked transistors of claim 4, further comprising:
   an insulating material separating the first channel from the second channel.

6. The stacked transistors of claim 1, wherein the first transistor and the second transistor include at least one of finFETs and nanosheet transistors.

7. The stacked transistors of claim 1, wherein the first transistor and the second transistor include an NFET and a PFET.

8. A system comprising:
   first stacked transistors, the first stacked transistors comprising:
      a first transistor comprising a first gate;
      a second transistor comprising a second gate, wherein the second transistor is above the first transistor;
      a dielectric preventing direct contact between the first gate and the second gate; and
      a first sidewall strap directly connected to the first gate and to the second gate to provide an electrical path between the first gate and the second gate, wherein the first sidewall strap connects the first transistor and the second transistor.

9. The system of claim 8, wherein the first stacked transistors further comprise:
a second sidewall strap connecting the first transistor and the second transistor, wherein:
the first sidewall strap is directly connected to a first side of the first gate and a first side of the second gate, and
the second sidewall strap is directly connected to a second side of the first gate and a second side of the second gate.

10. The system of claim 9, further comprising:
second stacked transistors comprising a third transistor and a fourth transistor, wherein the second stacked transistors comprise a single sidewall strap connecting the third transistor and the fourth transistor.

11. The system of claim 9, further comprising:
second stacked transistors comprising a third transistor and a fourth transistor, wherein the second stacked transistors are non-sidewall strap stacked transistors.

12. The system of claim 10, further comprising:
third stacked transistors comprising a fifth transistor and a sixth transistor, wherein the third stacked transistors comprise a single sidewall strap connecting the fifth transistor and the sixth transistor.

13. The system of claim 8, wherein the first transistor and the second transistor include at least one of finFETs and nanosheet transistors.

14. A method of forming stacked transistors with sidewall straps, the method comprising:
forming a first semiconductor and a second semiconductor separated by an insulator layer;
shaping the first semiconductor and the second semiconductor into a first channel and a second channel;
forming a first gate;
depositing a dielectric layer on top of the first gate;
forming a second gate on top of the dielectric layer, wherein the dielectric layer separates the first gate from the second gate; and
forming a first sidewall strap directly connected to the first gate and to the second gate to provide an electrical path between the first gate and the second gate.

15. The method of claim 14, further comprising:
forming a second sidewall strap proximately connected to the first gate and the second gate.

16. The method of claim 15, further comprising:
masking the first sidewall strap and the second sidewall strap to prevent removal of the first sidewall strap and the second sidewall strap.

17. The method of claim 15, further comprising:
masking the first sidewall strap to prevent removal of the first sidewall strap; and
removing the second sidewall strap.

18. The method of claim 14, further comprising:
depositing a high-k dielectric around at least portions of the first channel and the second channel.

19. The method of claim 14, further comprising:
growing a bottom epitaxial proximately connected to the first channel; and
growing a top epitaxial proximately connected to the second channel.

20. The method of claim 14, wherein the first sidewall strap is a metal strap including at least one of TiN and TiAlC.

* * * * *